United States Patent
Yamamoto et al.

(10) Patent No.: US 9,525,273 B1
(45) Date of Patent: Dec. 20, 2016

(54) METHOD OF FORMING AN IGNITER CIRCUIT AND STRUCTURE THEREFOR

(71) Applicant: SEMICONDUCTOR COMPONENTS INDUSTRIES, LLC, Phoenix, AZ (US)

(72) Inventors: Yasunori Yamamoto, Ora-gun (JP); Mikio Yamagishi, Fukaya (JP)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 15/136,230

(22) Filed: Apr. 22, 2016

Related U.S. Application Data

(60) Provisional application No. 62/256,983, filed on Nov. 18, 2015.

(51) Int. Cl.
  *H05B 33/08* (2006.01)
  *H01T 15/00* (2006.01)
  *H03K 17/567* (2006.01)
  *F02P 3/045* (2006.01)

(52) U.S. Cl.
  CPC ............ *H01T 15/00* (2013.01); *F02P 3/0453* (2013.01); *H03K 17/567* (2013.01)

(58) Field of Classification Search
  CPC combination set(s) only.
  See application file for complete search history.

(56) References Cited

U.S. PATENT DOCUMENTS

| | | | |
|---|---|---|---|
| 6,378,514 B1 | 4/2002 | Kaminaga et al. | |
| 7,755,297 B2* | 7/2010 | Lee | G09G 3/3406 315/224 |
| 7,852,008 B2* | 12/2010 | Kurachi | H02M 3/3378 315/177 |
| 7,973,497 B2* | 7/2011 | Nishida | H05B 41/2828 315/209 R |
| 8,264,161 B2* | 9/2012 | Toda | H05B 41/2885 315/209 R |
| 8,436,623 B2 | 5/2013 | Oura et al. | |
| 2015/0041849 A1 | 2/2015 | Gillberg et al. | |

FOREIGN PATENT DOCUMENTS

| | | |
|---|---|---|
| JP | 2002-106450 | 4/2002 |
| JP | 2003-314419 | 11/2003 |
| JP | 2009-055549 | 3/2009 |
| JP | 2011-155708 | 8/2011 |
| JP | 2011-185163 | 9/2011 |
| JP | 2014-180073 | 9/2014 |
| WO | 2014109067 A1 | 7/2014 |

OTHER PUBLICATIONS

ON Semiconductor, "NIS5112—Electronic Fuse," Semiconductor Components Industries, LLC, Publication Order No. NIS5112/D, Jan. 2011, Rev. 9, 9 pages.

* cited by examiner

*Primary Examiner* — Douglas W Owens
*Assistant Examiner* — Jianzi Chen
(74) *Attorney, Agent, or Firm* — Robert F. Hightower

(57) ABSTRACT

In one embodiment, an igniter circuit may include a circuit to determine if the current through a load switch exceeds a threshold value, and to responsively disable a second switch that couples DC power to the igniter circuit.

20 Claims, 13 Drawing Sheets

METHOD OF FORMING AN IGNITER CIRCUIT AND STRUCTURE THEREFOR

CROSS-REFERENCE TO RELATED APPLICATIONS

This application claims priority to U.S. Provisional Application No. 62/256,983, filed on Nov. 18, 2015, entitled "METHOD OF FORMING AN IGNITER CIRCUIT AND STRUCTURE THEREFOR," invented by Yasunori Yamamoto and Mikio YAMAGISHI, and is incorporated herein by reference and priority thereto for common subject matter is hereby claimed.

This application is also related to an application entitled "METHOD OF FORMING AN IGNITER CIRCUIT AND STRUCTURE THEREFOR" having a common assignee, and inventors Yasunori YAMAMOTO and Mikio YAMAGISHI which is filed concurrently herewith and which is hereby incorporated herein by reference.

BACKGROUND OF THE INVENTION

The present invention relates, in general, to electronics, and more particularly, to semiconductors, structures thereof, and methods of forming semiconductor devices.

In the past, the semiconductor industry utilized various methods and structures to build semiconductor devices to control an ignition coil of an internal combustion engine, such as an engine for a vehicle such as a car, etc. In some embodiments, a semiconductor load switch or load switch was connected to a primary side of an ignition coil to control a spark plug of the engine. In some embodiment, the load switch could be an insulated gate bipolar transistor (IGBT). A controller of the semiconductor device enabled and disabled the load switch to create a large voltage on a secondary side of the ignition coil resulting in a spark through the spark plug. In another event that other elements that are connected to ground failed, the increased current through the failed elements could cause an open circuit in the fuse in order to protect the system.

In some instances, there could be a failure of the load switch or elements of the semiconductor device that could result in a large current through the coil which could eventually damage the semiconductor device or possibly the coil, or the engine, or the vehicle. In some conditions, the large current may also flow through the element that failed, which could also lead to damage of the coil or of the engine, among other things. Some embodiments included a fuse that was connected between a voltage source, and the primary side of the ignition coil and/or elements connected to ground. In the event that the load switch failed, the increased current through the ignition coil could cause an open circuit in the fuse in order to protect the system.

In some applications, the sensitivity of the fuse may be too high and the fuse may form an open circuit during normal operating conditions. Thus, the semiconductor device and, in some case, together with the vehicle component which include the semiconductor device may have to be replaced in order to restore operational condition to the system. Replacing the semiconductor device resulted in increased cost. Additionally, the reliability of the vehicle may be degraded. In other conditions, the sensitivity of the fuse may be too low and the semiconductor device may be damaged before the fuse forms the open circuit. In this example, the semiconductor device would also have to be replaced which would lead to increased cost. In some cases, the failure could result in more serious damage and may even result in a fire.

Accordingly, may be desirable to have a device or method that can more accurately protect the semiconductor device from damage, and/or more accurately protect the semiconductor device from a short circuit condition, and/or that can reduce operating costs of the ignition system.

Figure 1:
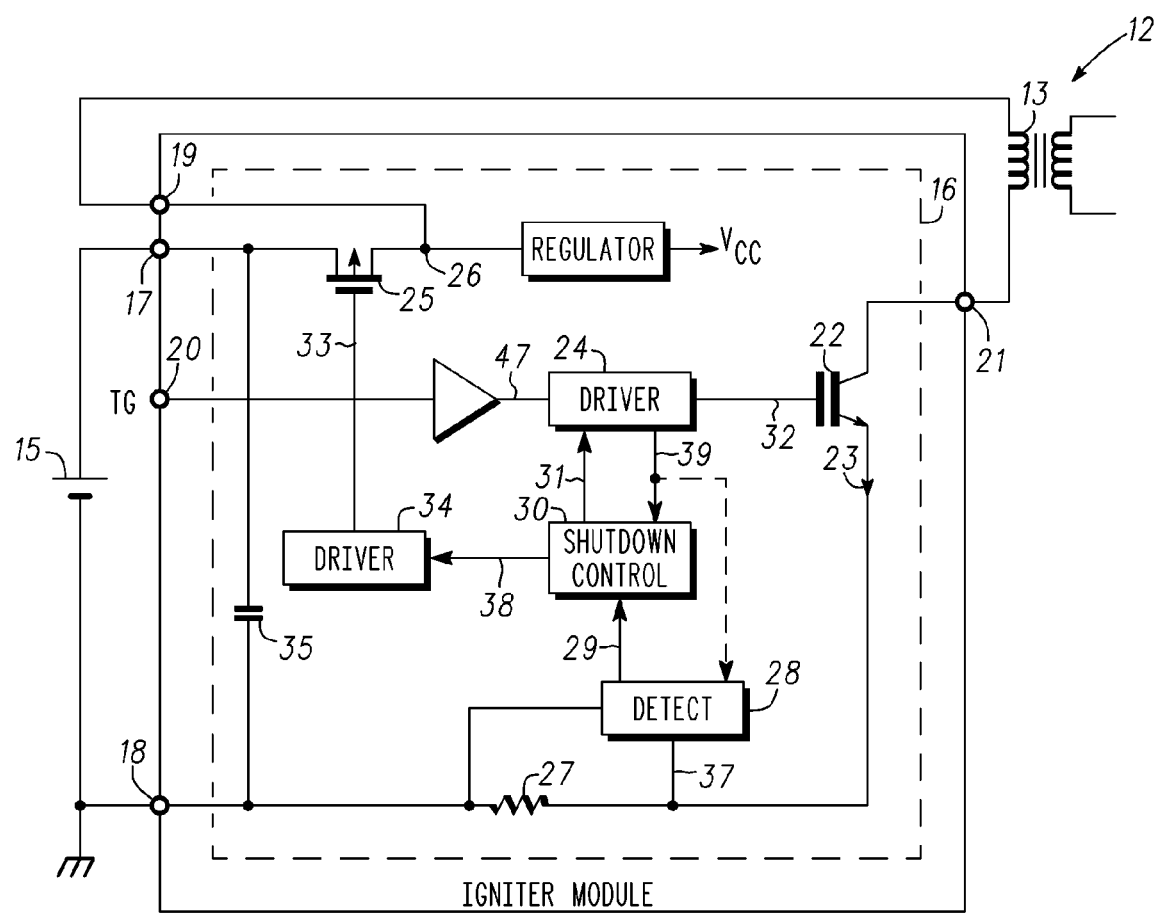
FIG. 1 schematically illustrates an example of an embodiment of a portion of an ignition system that includes an igniter circuit in accordance with the present invention.

For simplicity and clarity of the illustration(s), elements in the figures are not necessarily to scale, some of the elements may be exaggerated for illustrative purposes, and the same reference numbers in different figures denote the same elements, unless stated otherwise. Additionally, descriptions and details of well-known steps and elements may be omitted for simplicity of the description. As used herein current carrying element or current carrying electrode means an element of a device that carries current through the device such as a source or a drain of an MOS transistor or an emitter or a collector of a bipolar transistor or a cathode or anode of a diode, and a control element or control electrode means an element of the device that controls current through the device such as a gate of an MOS transistor or a base of a bipolar transistor. Additionally, one current carrying element may carry current in one direction through a device, such as carry current entering the device, and a second current carrying element may carry current in an opposite direction through the device, such as carry current leaving the device. Although the devices may be explained herein as certain N-channel or P-channel devices, or certain N-type or P-type doped regions, a person of ordinary skill in the art will appreciate that complementary devices are also possible in accordance with the present invention. One of ordinary skill in the art understands that the conductivity type refers to the mechanism through which conduction occurs such as through conduction of holes or electrons, therefore, that conductivity type does not refer to the doping concentration but the doping type, such as P-type or N-type. It will be appreciated by those skilled in the art that the words during, while, and when as used herein relating to circuit operation are not exact terms that mean an action takes place instantly upon an initiating action but that there may be some small but reasonable delay(s), such as various propagation delays, between the reaction that is initiated by the initial action. Additionally, the term while means that a certain action occurs at least within some portion of a duration of the initiating action. The use of the word approximately or substantially means that a value of an element has a parameter that is expected to be close to a stated value or position. However, as is well known in the art there are always minor variances that prevent the values or positions from being exactly as stated. It is well established in the art that variances of up to at least ten percent (10%) (and up to twenty percent (20%) for semiconductor doping concentrations) are reasonable variances from the ideal goal of exactly as described. When used in reference to a state of a signal, the term "asserted" means an active state of the signal and the term "negated" means an inactive state of the signal. The actual voltage value or logic state (such as a "1" or a "0") of the signal depends on whether positive or negative logic is used. Thus, asserted can be either a high voltage or a high logic or a low voltage or low logic depending on whether positive or negative logic is used and negated may be either a low voltage or low state or a high voltage or high logic depending on whether positive or negative logic is used. Herein, a positive logic convention is used, but those skilled in the art understand that a negative logic convention could also be used. The terms first, second, third and the like in the claims or/and in the Detailed Description of the Drawings, as used in a portion of a name of an element are used for distinguishing between similar elements and not necessarily for describing a sequence, either temporally, spatially, in ranking or in any other manner. It is to be understood that the terms so used are interchangeable under appropriate circumstances and that the embodiments described herein are capable of operation in other sequences than described or illustrated herein. Reference to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but in some cases it may. Furthermore, the particular features, structures or characteristics may be combined in any suitable manner, as would be apparent to one of ordinary skill in the art, in one or more embodiments.

DETAILED DESCRIPTION OF THE DRAWINGS

FIG. 1 schematically illustrates an example of an embodiment of a portion of an ignition system 10 that includes an igniter circuit 16 that may in some embodiments be a part of an igniter module of system 10. In some embodiments, the igniter module may have embodiments that may include other devices, in addition to circuit 16, that are omitted from FIG. 1 for clarity of the drawings and description. Some embodiments of system 10 may also include an ignition coil 12 having a primary winding 13 and a secondary winding.

Circuit 16 may include an embodiment having an output 21 that is configured to be connected to winding 13, such as for example connected to one terminal of winding 13. For example, output 21 may be connected to sink current from winding 13. Circuit 16 may have an embodiment that includes an input 17 configured to be connected to a positive terminal of a DC voltage source 15, and may also include an input 18 that may be configured to be connected to a common return voltage, such as for example a ground reference. The DC voltage source may be a battery as illustrated in FIG. 1 or may be other DC voltage sources such as an output of a DC voltage regulator. In an embodiment, circuit 16 may also include a protected output 19 that may be configured to supply power from input 17 to a second terminal of primary winding 13.

Circuit 16 may, in some embodiments, include a load switch that is configured to be connected to one terminal of primary winding 13. For example, may be connected to sink current from winding 13. In some embodiments, the load switch may be an IGBT 22, but may be other devices in other embodiments, such as for example a bipolar transistor or an MOS transistor. Thus, the reference to IGBT 22 is understood to be a reference to a load switch but the configuration of IGBT 22 is used for convenience of the explanation. Although IGBT 22 is used as a convenient reference for the load switch device, the embodiments described herein are not limited to an IGBT as the only embodiment of the load switch device. In some embodiments, the load switch, such as for example IGBT 22, may be on a separate semiconductor die from circuit 16 or in other embodiments may be on the same die as circuit 16. Circuit 16 may include an embodiment in which the load switch has a first current carrying electrode connected to receive current from input 21, such as receive current from coil 12, a second current carrying electrode connected to return current to return 18, and a control electrode configured to receive a drive signal to selectively enable and disable the load switch.

Circuit 16 may include a trigger (TG) input 20 that is configured to receive an ignition trigger signal or trigger signal (TG) to allow enabling IGBT 22. Circuit 16 may be configured to form a signal 47 that is representative of the trigger signal (TG). A driver circuit 24 of circuit 16 may be configured to form a drive signal 32 that is sufficient to selectively enable and disable IGBT 22. In other embodiments driver circuit 24 may be a portion of another circuit of circuit 16. In some embodiments, circuit 16 may include a hysteresis buffer inserted between input 20 and circuit 24 in order to receive the trigger signal and form signal 47. Circuit 24 may, in some embodiments, be configured to form a signal 39 that may be representative of a control state of the control of IGBT 22 such as for example an asserted or negated state of the signal used to control the state of IGBT 22. Thus, in some embodiments signal 39 may be asserted to represent the enabled or asserted control state of IGBT 22, and signal 39 may be negated to represent the disabled or negated control state of IGBT 22. Those skilled in the art will appreciate that IGBT 22 may fail such as in a shorted state for example, but the control state of IGBT 22 may be in a negated control state to disable IGBT 22 even though current may flow through IGBT 22 due to the shorted state of IGBT 22. Thus, signal 39 may be representative of the control state of IGBT 22, such as for example representative of a signal that is formed to enable or to disable IGBT 22. In some embodiments, signal 39 may be omitted. In some embodiments the trigger signal (TG)(TG) or signal 47, or drive signal 32 may be representative of the control state of IGBT 22.

A selectively enabled switch device of circuit 16 may, in some embodiments, be connected between input 17 and output 19. Some embodiments of circuit 16 may be configured to selectively disable the selectively enabled switch device in the event of an IGBT short circuit, such as for example a short in IGBT 22 or a short formed across IGBT 22. For example, a short from output 21 to the emitter of IGBT 22 may be one example of a short across IGBT 22. In an embodiment, the selectively enabled switch device may be an MOS transistor 25. An embodiment may include that transistor 25 may be configured as a high side (HS) switch. In at least one embodiment, the body of transistor 25 may be floating and not directly connected to a voltage potential or to a control signal. Transistor 25 may be other types of switch devices in other embodiments. For example, transistor 25 may be a bipolar transistor or an electronic fuse integrated circuit. One example of an electronic fuse has a part number of NIS5112 and is provided by ON Semiconductor (dba) having an office at 5005 E. McDowell Road, Phoenix, Ariz. 85008.

An embodiment of a detect circuit 28 of circuit 16 may be configured to monitor the value of a switch current or load current 23 that flows through IGBT 22. As will be seen further hereinafter, an embodiment of circuit 28 may be configured to detect the value of current 23 being greater than a first threshold value. In some embodiments, the first threshold value may be a low threshold value. The first threshold value may have embodiments that are greater than zero or alternately greater than the value of the common return voltage on terminal 18. Circuit 16 may, in some embodiments, also include a sense element that may be configured to form a sense signal 37 that is representative of current 23. For example, one embodiment of the sense element may be configured as a resistor 27 that is connected in series with IGBT 22 and the common return voltage of input 18 such that sense signal 37 is representative of the value of current 23. For example, resistor 27 may have one terminal connected to the emitter of IGBT 22 and a second terminal connected to input 18. The sense circuit is configured such that a first sense value of signal 37 is representative of the first threshold value of current 23. Circuit 28 may be configured to receive signal 37. Those skilled in the art will appreciate that the sense element may be other well-known elements that can form a sense signal that is representative of current 23. For example, IGBT 22 may be formed as multi-emitter IGBT where one or more emitters are used as a sense element that forms a current that is representative of current 23. A sense type of transistor generally is formed to include a main transistor portion and a sensing portion. Typically, the sense type of transistor is formed of many transistor cells that are interconnected to form a larger transistor that can have a large switch current. A few of the cells have their emitters separated from the emitters of the remaining cells and are brought to a separate external terminal or sense terminal. The remainder of the emitters are connected together to form the emitter for IGBT 22. One example of a sense type of transistor is disclosed in U.S. Pat. No. 4,553,084 issued to Robert Wrathall on Nov. 12, 1985, which is hereby incorporated herein by reference.

Circuit 16 may have an embodiment that includes a shutdown control circuit 30 that may be configured to form a control signal 38 to disable transistor 25 in response to current 23 having a value that is greater than the first threshold value. In some embodiments, circuit 30 may also be configured to form a drive disable signal 31 to disable IGBT 22 in response to current 23 having a value that is greater than the first threshold value. In some embodiments, signal 31 may be omitted.

An embodiment of circuit 16 may include a driver circuit 34 that is configured to receive control signal 38 from circuit 30 and form a drive signal 33 that is sufficient to selectively enable and disable transistor 25. In some embodiments circuit 34 may be a portion of another circuit, such as for example circuit 30. In some embodiments, transistor 25 may have a source connected to input 17 and a drain commonly connected to output 19 and to an internal node 26. A gate of transistor 25 may be connected to receive control signal 38 from circuit 30 through circuit 34, such as for example may be connected to an output of circuit 34.

An embodiment of circuit 16 may include an optional battery capacitor 35 that may be connected across the DC voltage source, for example connected between inputs 17 and 18. In other embodiments, capacitor 35 may be omitted or may be external to circuit 16. Capacitor 35, in most embodiments, is a decoupling capacitor to smooth the waveform received by circuit 16. In some embodiments, circuit 16 may include a regulator circuit that receives power from node 26 and forms the operating voltage (Vcc) for operating the circuit elements of circuit 16 such as for example, circuits 28 and/or 30.

In normal operation, transistor 25 may be enabled to selectively couple the DC voltage source on input 17 to the primary side of coil 12 and to internal node 26. In normal operation, the trigger signal (TG) may be asserted to enable IGBT 22. Enabling IGBT 22 causes current 23 to flow and form a magnetic field within coil 12. Subsequently, the trigger signal may change state to allow disabling IGBT 22. Disabling IGBT 22 causes a voltage spike on the primary side of coil 12, and accordingly, a large voltage spike induced on the secondary side of coil 12 in order to create a spark through the spark plug (not shown).

In the event of the IGBT short circuit such as a short of IGBT 22 or a short that develops across IGBT 22, the value of current 23 resulting from the IGBT short circuit condition may, in some embodiments, be limited by the resistance of coil 12. In one non-limiting example embodiment, the resistance of coil 12 may be in the range of approximately 0.3~1.0 ohm. For such a non-limiting example configuration, the value of current 23 resulting from the shorted condition may not be much higher than the normal value of current 23 when IGBT 22 is enabled under a non-shorted condition. Thus in some configurations it might be hard to distinguish the current resulting from the IGBT short circuit from the normal value of current 23 while IGBT 22 is enabled under the non-shorted condition.

Consequently, in an embodiment, circuit 16 may be configured to detect the value of current 23 having a value no less than the first threshold value during at least a portion of the time that IGBT 22 is disabled in order to detect the IGBT short circuit. For example, under the condition that the control state of IGBT 22 is in a state to disable IGBT. Those skilled in the art will appreciate that if IGBT 22 itself is in a shorted condition, it may not be possible to disable IGBT 22 even though the control signals to IGBT 22 are in a control state to disable IGBT 22. One example of the negated control state may include that drive signal 32 to control IGBT 22 may be negated such that IGBT 22 should be disabled or alternately under the condition that the trigger signal is disabled.

In one embodiment, in the event of the shorted IGBT condition, circuit 16 may be configured to decouple or substantially disconnect the DC voltage source from node 26 and from coil 12 in response to the conditions of the control state of IGBT 22 is in a state to disable IGBT in combination with current 23 having a value no less than the first threshold value. An embodiment may include that circuit 16 may also be configured to disable IGBT 22 in response to the conditions of current 23 having a value no less than the first threshold value in combination with the control state of IGBT 22 having a negated control state to disable IGBT 22.

Circuit 28 may include an embodiment that may be configured to detect that sense signal 37 is greater than the sense value, thus current 23 is greater than the first threshold value, and to responsively assert detect signal 29. In other embodiments, circuit 28 may be configured to assert signal 29 in response to the combination of detecting current 23 having a value no less than the first threshold value and the control state of IGBT 22 is in a state to disable IGBT 22, for example a negated control state. In some embodiments circuit 28 may be configured to assert signal 29 in response to detecting current 23 having a value no less than the first threshold value regardless of the state of IGBT 22. An embodiment may include that circuit 30 may be configured to disable transistor 25 in response to the negated control state of IGBT 22 in combination with current 23 having a value that is no less than the first threshold value. For example, circuit 30 may be configured to receive signals 29 and 39 and to assert control signal 38 and drive disable signal 31 in response to an asserted state of signals 29 and 39 (or alternately signal 32).

An embodiment of circuit 30 may be configured to receive detect signal 29 from circuit 28 and assert drive disable signal 31 and control signal 38 in response to the conditions of a negated value of drive signal 32 in combination with an asserted value of detect signal 29. Another embodiment of circuit 16 may be configured to, in the event of the IGBT short circuit, decouple or substantially disconnect the DC voltage source from the internal regulator in response to the combination of current 23 exceeding the first threshold value and a negated value of drive signal 32. Circuit 30 may also be configured to disable IGBT 22 or alternately maintain IGBT 22 disabled for that set of conditions. For example, circuit 30 may be configured to receive detect signal 29 from circuit 28 and assert signal 38 in response to current 23 exceeding the first threshold value in combination with a negated control state of IGBT 22, such as for example a negated state of drive signal 32. Circuit 30 may also include an embodiment configured to assert signal 31 to disable IGBT 22, or alternately maintain IGBT 22 disabled, in response to that set of conditions.

Figure 2:
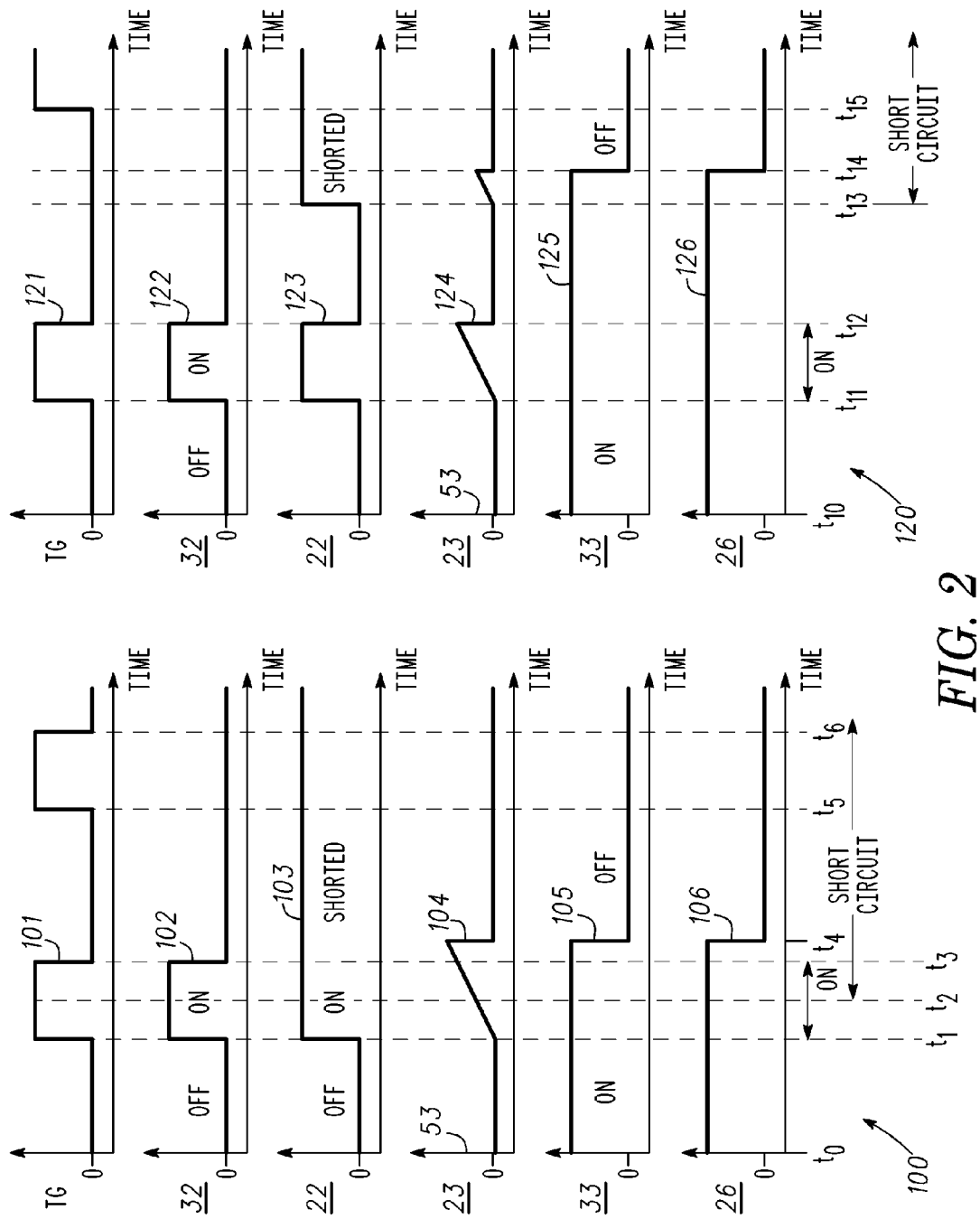
FIG. 2 is a graph illustrating examples of embodiments of some signals that may be formed during some of the operations of the igniter circuit of FIG. 1 in accordance with the present invention.

FIG. 2 is a graph illustrating examples of embodiments of some signals that may be formed during some of the operations of circuit 16. A graph 100 illustrates example embodiments of portions of some signals that may be formed during one example operation of circuit 16. A graph 120 illustrates example embodiments of portions of some signals that may be formed during a different example of some operations of circuit 16. The abscissa indicates time and the ordinate indicates increasing value of the illustrated signals. Plots 101 and 121 illustrate examples of embodiments of the trigger signal (TG). Plots 102 and 122 illustrates examples of embodiments of drive signal 32 to IGBT 22, plots 103 and 123 illustrate different examples of embodiments of a condition of IGBT 22, for example enabled or disabled or shorted conditions. Those skilled in the art will appreciate that in some embodiments signal 32 may have a finite rise and fall time due to the input capacitance of IGBT 22 and that plots 102 and 122 may represent idealized representations of a digital signal without the associated rise and fall times. Plots 104 and 124 illustrate different examples of embodiments of current 23. A value 53 illustrates an example of an embodiment of the first threshold value as will be seen further hereinafter. Plots 105 and 125 illustrates examples of different embodiments of drive signal 33, or a signal that is representative of drive signal 33, to transistor 25, and plots 106 and 126 illustrated examples of different embodiments of the value of the operating voltage VCC.

Referring to graph 100, during one non-limiting example of the operation of circuit 16, assume that at a time t0, transistor 25 is enabled and coupling power from the DC voltage source to node 26, to the internal regulator, and to the primary of coil 12 as illustrated by plots 105 and 106. At time t1, assume that circuit 16 receives an asserted trigger signal (TG) as illustrated by plot 101. The trigger signal enables IGBT 22 as illustrated by plots 102 and 103. Current 23 begins to flow and gradually increases in response to the enabling of IGBT 22. Assume that at a time t2 the IGBT short circuit occurs. At a time t3 the trigger signal (TG) is negated which results in negating drive signal 32 to IGBT 22 as illustrated by plots 101 and 102. However, due to the IGBT short circuit condition current 23 continues to flow and in some embodiments may increase as illustrated by plots 103 and 104. Circuit 28 detects that the value of current 23 is greater than the first threshold value and asserts detect signal 29 to circuit 30. In some embodiments, circuit 28 may assert signal 29 in response current 23 having a value no less than the first threshold value at any time during the operation of circuit 16. In other embodiments, circuit 28 may be configured to assert signal 29 in response current 23 having a value no less than the first threshold value in combination with a negated control state of IGBT 22. In response to the combination of the negated state of drive signal 32 (or alternately signal 39) and to current 23 having a value no less than (or alternately greater than) the first threshold value, circuit 30 asserts control signal 38 to transistor 25 to disable transistor 25. Those skilled in the art will note that the time interval between times t3 and t4 may be very short but is exaggerated in FIG. 2 for the purposes of illustration. Asserting signal 38 results in negating drive signal 33 to transistor 25 and disabling transistor 25. Disabling transistor 25 results in decoupling or substantially disconnecting the primary of coil 12 and the internal regulator, thus the operating voltage (VCC), from the external supply voltage thereby reducing damage to IGBT 22 and/or circuit 16. Other portions of system 10, such as for example coil 12 may also be protected. In some embodiments, in response to the combination of the negated state of drive signal 32 (or alternately signal 39) and to current 23 having a value no less than the first threshold value, circuit 30 may assert signal 31 to disable or maintain IGBT 22 disabled. Circuit 30 may include an embodiment having a latch to latch the state of signal 31.

Referring to graph 120, assume that at a time t10 transistor 25 is enabled to couple power to node 26 and to the primary of coil 12. At time t11, circuit 16 receives the asserted state of the trigger signal (TG) to enable IGBT 22 as illustrated by plots 121-124. At a time t12 the trigger signal is negated and IGBT 22 is disabled as illustrated by plots 121-124. Assume that subsequently at a time t13, an IGBT short circuit occurs at a time when IGBT 22 is disabled as illustrated by plots 121-124. Circuit 28 detects that current 23 is flowing and is greater than the first threshold value. Circuit 28 responsively asserts detect signal 29 and circuit 30 asserts signals 31 and 38 in response to the combination of the asserted state of detect signal 29 and the negated control state of IGBT 22, such as for example the negated state of drive signal 32, as illustrated by plot 125. Disabling transistor 25 assists in protecting IGBT 22 and/or circuit 16 from damage as explained hereinbefore.

Figure 3:
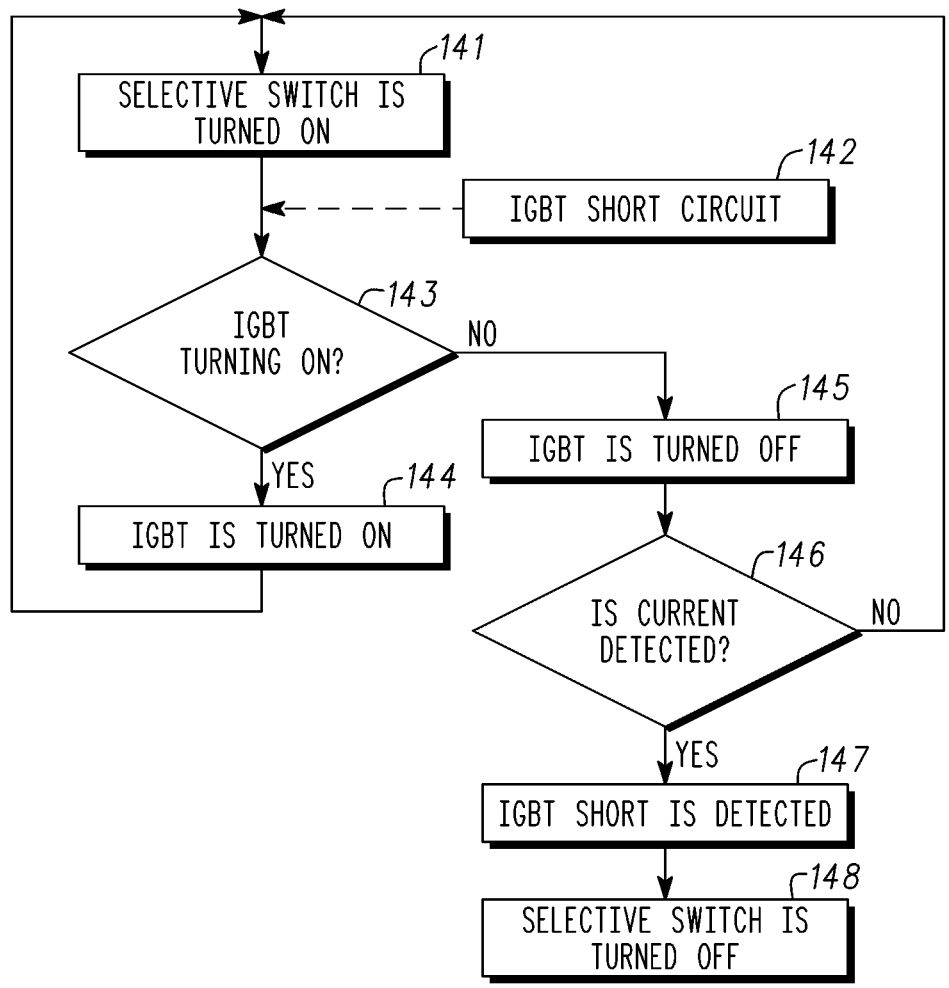
FIG. 3 includes a flow chart illustrating some steps in an example of an embodiment of a method of protecting the igniter circuit of FIG. 1 in accordance with the present invention.

FIG. 3 includes a flow chart 140 illustrating some steps in an example of an embodiment of a method of protecting circuit 16 or alternately system 10. At a step 141, transistor 25 is enabled. Subsequently during the operation of circuit 16, an IGTB short circuit occurs as illustrated by a step 142. Circuit 16 may be configured to determine if IGBT 22 has received an asserted control state of IGBT 22, for example an asserted state of drive signal 32, as illustrated by step 143. If IGBT 22 is enabled, no action is taken as illustrated by step 144 returning to step 141. If the control state of IGBT 22 is not asserted, as illustrated by step 145, the method determines if current 23 is flowing as illustrated by step 146. If current 23 is less than the first threshold value the method returns to step 141. In one example embodiment, the first threshold value may be a value that is less than a target peak value of current 23 that is desired during normal operation of system 10. Those skilled in the art will appreciate that the target peak value of current 23 may vary within a range of values around the target peak value. For example, the target peak value may be twenty amperes (20 A) and the range of values may be plus or minus five percent (5%) around the twenty amperes. In some embodiments, the first threshold value may be a percentage of the target peak value (for example less than one hundred percent), or in other embodiments may be five to ten percent (5-10%) less than the target peak value of current 23. In other embodiments the first threshold value may be a fraction of the target peak value of current 23, such as for example one-half or one-fourth the target peak value. In one example embodiment, the target peak value of current 23 may be approximately ten amperes (10 A) or may be between ten to twenty amperes (10-20 A), and the first threshold value may be between one to three amperes (1-3 A).

Figure 12:
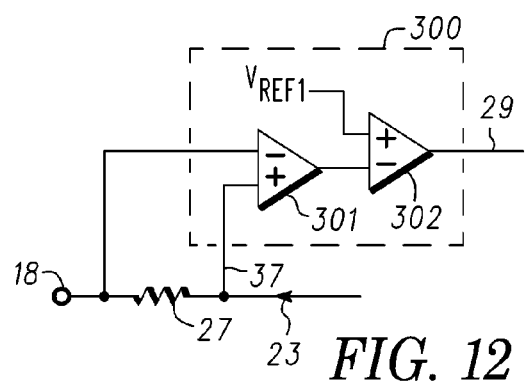
FIG. 12 schematically illustrates an example of an embodiment of a portion of a detect circuit that may be an alternate embodiment of a portion of the circuit of FIG. 1 in accordance with the present invention.

Referring now to FIG. 12, FIG. 12 schematically illustrates an example of an embodiment of a portion of a detect circuit 300 that may be an alternate embodiment to circuit 28. Circuit 300 includes a differential amplifier 301 configured to form a signal on the output of amplifier 301 that is representative of error signal 37. Those skilled in the art will appreciate that circuit 301 may be used instead of circuit 28. In an embodiment, amplifier 301 is configured to monitor the voltage across resistor 27. An inverting input of amplifier 301 is connected to input 18 and a non-inverting input is connected to receive signal 37. Circuit 300 also includes a comparator 302. Comparator 302 is configured to receive the signal that is representative of sense signal 37 and form signal 29 on an output of comparator 302. An inverting input of comparator 302 is connected to the output of amplifier 301 and a non-inverting input is connected to receive a reference voltage Vref1.

Figure 13:
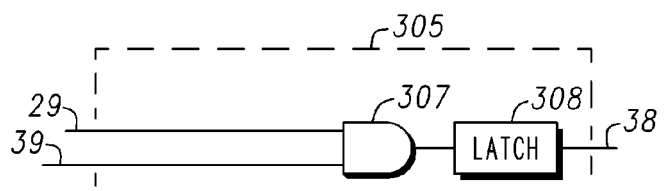
FIG. 13 schematically illustrates an example of an embodiment of a portion of a shutdown control circuit that may be an alternate embodiment of a portion of the circuit of FIG. 1 in accordance with the present invention.

FIG. 13 schematically illustrates an example of an embodiment of a portion of a shutdown control circuit 305 that may be an alternate embodiment of circuit 30. Circuit 305 is configured to receive signal 39 and detect signal 29 and form control signal 38. Those skilled in the art will appreciate that circuit 305 may be used instead of circuit 30. An embodiment may include that circuit 305 is configured to assert signal 38 in response to the asserted state of signal 29 and a negated state of signal 39. Circuit 305 includes an AND gate 307 having a first input connected to receive signal 39, and a second input connected to receive signal 29. An output of gate 307 is connected to a trigger input of a latch 308. Latch 308 is configured to latch the state of gate 307, and an output of latch 308 is configured to form signal 38. Some embodiments of circuit 305 may include that latch 308 remains latched until the supply voltage, such as for example Vcc is removed.

Figure 4:
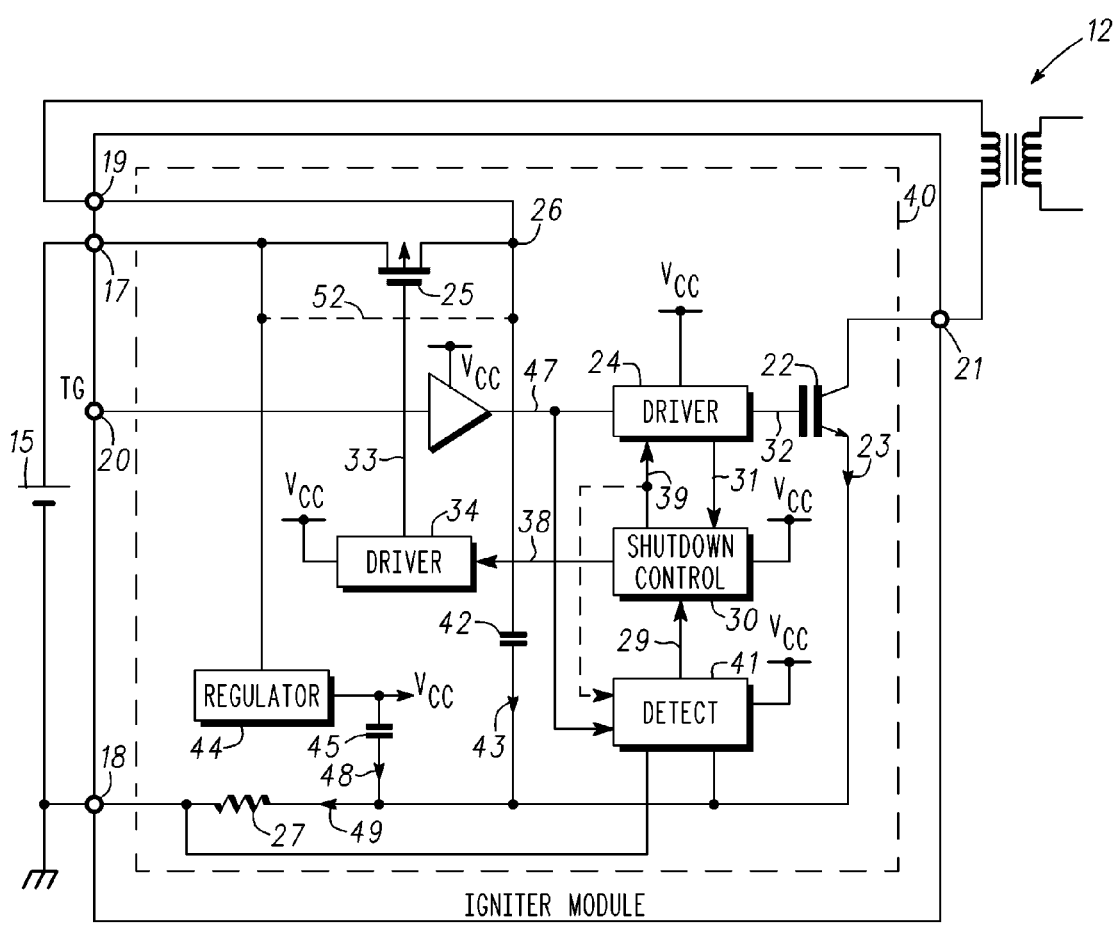
FIG. 4 schematically illustrates an example of an embodiment of a portion of an igniter circuit that may be an alternate embodiment of the igniter circuit of FIG. 1 in accordance with the present invention.

Referring now to FIG. 4, FIG. 4 schematically illustrates an example of an embodiment of a portion of an igniter circuit 40 that may be an alternate embodiment of circuit 16 that was described in the description of FIGS. 1-3. However, circuit 40 includes a battery capacitor 42, a regulator circuit or regulator 44, and an optional internal power supply capacitor 45. As will be seen further hereinafter, circuit 40 is configured to detect a short circuit between a power source and a common return voltage, such as ground voltage for example, and to responsively decouple the power source from supplying power.

In some embodiments, circuit 40 may include a detect circuit 41. In one embodiment, circuit 41 may be the same as circuit 28. In other embodiments circuit 41 may be substantially the same as circuit 28 but may include an adjustable threshold circuit that is configured to selectively set different values for the threshold value. In one embodiment, circuit 41 may be configured to selective detect current 23 having a value that is greater than the first threshold value and to detect current 23 having a value that is greater than a second threshold value. An embodiment may include that the second threshold value is greater than the first threshold value. An embodiment may include that the second threshold value is greater than the target peak value of current 23. An embodiment of circuit 41 may be configured to selectively select the first threshold value in response to the condition of the control state of IGBT 22 is negated such as for example in a state to disable IGBT. In an embodiment, the negated control state of IGBT 22 may be in response to a negated condition of drive signal 32, or a signal that is representative thereof such as for example signal 39 or alternately signal 47. Circuit 41 may also be configured to select the second threshold value in response to the condition of an asserted state of the control state of IGBT 22, such as for example the control state is in a condition to enable IGBT. In an embodiment, the asserted control state of IGBT 22 may be in response to an asserted state of drive signal 32 or the signal that is representative thereof.

Some prior igniter circuits may have included a battery capacitor connected across the external voltage source. The capacitor could be internal to the circuit in some embodiments. In some conditions, the battery capacitor could fail and a large current could continuously flow which could damage the prior igniter circuit.

Circuit 40 includes battery capacitor 42 that is connected such that any current flow through capacitor 42 is detected by circuit 41. For the example embodiment illustrated in FIG. 4, capacitor 42 is connected between node 26 and the input of the sense element so that circuit 41 may monitor the value of a current 43 through capacitor 42. Currents 23 and 43 flow to and through the sense element as a summed to form a load current 49.

An embodiment of circuit 40 may include that circuit 41 may be configured to detect switch current 43, or alternately load current 49, having a value that is greater than the second threshold value which could, in some embodiments represent a failure of capacitor 42, such as for example a shorted condition type of failure. The term "short circuit condition" as used herein includes a shorted condition in capacitor 42 or IGBT 22 or other circuit elements or connections between the elements that result in a short condition across IGBT 22 or across capacitor 42. A non-limiting example of the short circuit includes a short from output 19 to the input of the sense element, or a short from output 21 to the input of the sense element, or a short from input 17 to the input of the sense element, etc., or any short that causes an increase in current through the sense element such as an increase in load current 49. Under some conditions, circuit 40 may also be able to detect a shorted condition from output 19 to input 21. Circuit 40 may also include that circuit 41 may be configured to detect current 49 having a value that is greater than the first threshold value. An embodiment of circuit 40 may be configured to operate substantially the same as the operation of circuit 16 for the conditions of using the selected first threshold value.

Circuit 40 may have an embodiment that may include a regulator circuit 44 that is configured to directly receive power from the DC voltage source 15 and supply the internal operating voltage (VCC) to the internal circuits of circuit 40 in order to operate the internal circuits. Regulator 44 may have an input connected to input 17 to receive the DC voltage and an output the supplies the internal operating voltage (VCC). An optional smoothing or storage capacitor 45 may, in some embodiments, be connected to the output of regulator 44 in order to improve the stability of the internal operating voltage (VCC). In an embodiment, capacitor 45 may be connected between the output of regulator 44 and the input to the sense element. Capacitor 45 may be connected to other return nodes in other embodiments.

Figure 5:
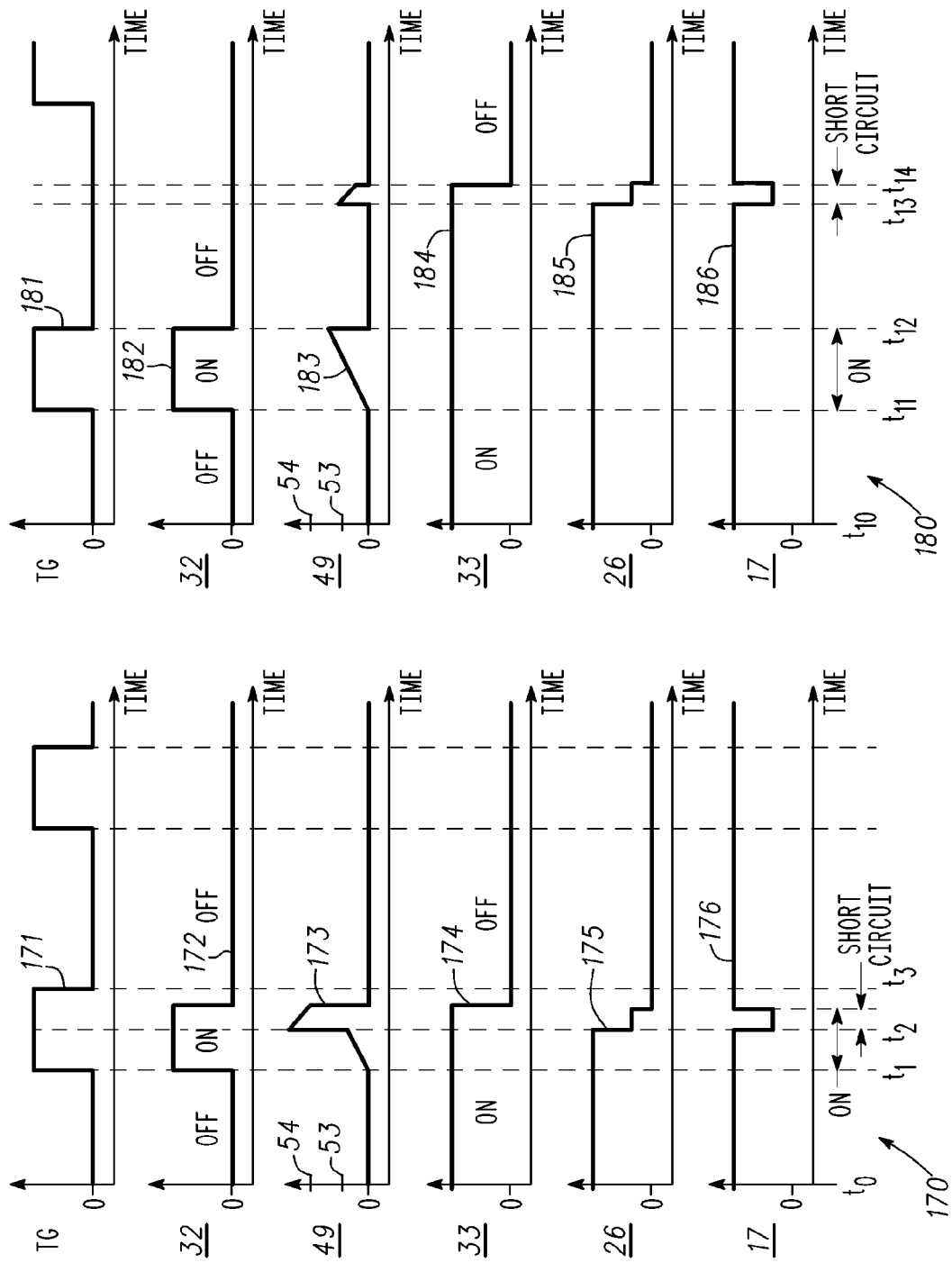
FIG. 5 is a graph illustrating examples of embodiments of some signals that may be formed during some of the operations of the igniter circuit of FIG. 4 in accordance with the present invention.

FIG. 5 is a graph illustrating examples of embodiments of some signals that may be formed during the operation of some example embodiments of circuit 40. A graph 170 illustrates example embodiments of portions of some signals that may be formed during one example operation of an embodiment of circuit 40. A graph 180 illustrates example embodiments of portions of some signals that may be formed during a different example operation of an embodiment of circuit 40. The abscissa indicates time and the ordinate indicates increasing value of the illustrated signals. Plots 171 and 181 illustrate examples of embodiments of the trigger signal (TG). Plots 172 and 182 illustrate examples of embodiments of drive signal 32 to IGBT 22, or a signal that is representative of drive signal 32. Those skilled in the art will appreciate that in some embodiments signal 32 may have a finite rise and fall time due to the input capacitance of IGBT 22 and that plots 172 and 182 may represent idealized representations of a digital signal without the associated rise and fall times. Plots 173 and 183 illustrate different examples of embodiments of current 49. A value 54 illustrates a non-limiting example of an embodiment of the second threshold value as will be seen further hereinafter. Plots 174 and 184 illustrate examples of different embodiments of drive signal 33 or a signal that is representative of drive signal 33. Plots 175 and 185 illustrate examples of different embodiments of the value of the voltage at node 26, and plots 176 and 186 illustrate examples of different embodiments of the value of the DC supply voltage received between inputs 17 and 18.

Referring to graph 170, assume that at a time t0, circuit 40 is operating, transistor 25 is enabled, the trigger signal (TG) is negated so that IGBT 22 is disabled, and current 49 is substantially zero. Those skilled in the art will appreciate that in some embodiments some leakage current or other induced current may be flowing which is consistent with the current being substantially zero. Circuit 41 may be configured to select the first threshold value in response to the negated control state of IGBT 22. For example, the negated state of drive signal 32 or a signal that is representative of signal 32 or alternately signal 39 or 47.

Assume that at a time t1, the trigger signal is asserted and IGBT 22 becomes enabled. Circuit 41 may be configured to select the second threshold value in response to the asserted control state of IGBT 22. For example, the asserted state of drive signal 32 or a signal that is representative of signal 32, or alternately signal 39. For example, circuit 41 receives the asserted state of drive signal 32, or the signal that is representative thereof, and selects the second threshold value to allow for current 23 flowing in response to the enabled state of IGBT 22. In an embodiment, circuit 40 may be configured to disable detecting the first threshold in such an operation. Current 23 begins to flow increasing the value of current 49 as illustrated by plot 173. Assume that at a time t2 a short circuit occurs. For example, assume that capacitor 42 becomes shorted while IGBT 22 is enabled. Current 43 increases thereby causing an increase in the value of current 49 as illustrated by plot 173. In some embodiments the shorted condition of capacitor 42 may cause a decrease in the voltage received from the DC voltage source as illustrated by plot 176 and may also decrease the voltage at node 26 as illustrated by plot 175. Circuit 41 detects that the value of current 49 is no less than the second threshold value and asserts detect signal 29. Circuit 30 receives the asserted state of detect signal 29 and disables transistor 25 responsively to the combination of current 49 exceeding the second threshold value and the asserted control state of IGBT 22, as illustrated by plot 174 just after time t2. For example, circuit 30 may assert control signal 38 which may cause circuit 34 to negate drive signal 33 to transistor 25 to disable transistor 25. Disabling transistor 25 decouples the DC voltage source from coil 12 and IGBT 22 thereby protecting circuit 40. Disabling transistor 25 also removes the shorted condition from the DC voltage source allowing the value of the voltage from the DC voltage source to increase as illustrated by plot 176 at time t3. Circuit 30 may also be configured to disable IGBT 22 in response to the short circuit. For example, circuit 30 may also assert signal 31 to disable IGBT 22 in response to the combination of current 49 having a value that is no less than the second threshold value and the asserted control state of IGBT 22. The asserted control state of IGBT 22 means a state of the control signals to IGBT 22 that would enable IGBT 22 if IGBT 22 is operating normally.

Because the value of current 49 will increase more rapidly in response to the short circuit condition than would the current through IGBT 22, the value of current 49 may rapidly rise to a large value. Using the second threshold to detect the value of current 49 allows circuit 40 to more rapidly detect the short circuit condition and more rapidly protect circuit 40. Under some conditions, if current 49 exceeds the second threshold, it may be possible that some element across the battery and GND might have failed and it may be advantageous to disable transistor 25 to stop the switch current very quickly regardless of the enabled or disabled state of IGBT 22. This may be referred to as a quick shutdown.

Referring now to graph 180, at a time t10 assume that transistor 25 is enabled and the trigger signal (TG) is negated, thus IGBT 22 is disabled and the value of current 49 is substantially zero as illustrated by plots 181-186. Circuit 40 responsively selects the first threshold value for detecting the value of current 49. Assume that at a time t11 the trigger signal is asserted and IGBT 22 becomes enabled as illustrated by plots 181-182. Circuit 40 responsively selects the second threshold value as the value for detecting the value of current 49. Current 23 begins to increase thereby increasing current 49 as illustrated by plot 183. At a time t12, the trigger (TG) signal is negated thereby negating drive signal 32. In response to the control signals to IGBT 22 having a negated control state, circuit 41 may be configured to select the first threshold value for detecting the value of current 49. For example, circuit 41 may enable the detection of the first threshold value in response to the negated state of drive signal 32, or a signal that is representative thereof or alternately signal 39. Assume that at a time t13, a short circuit condition occurs. The short circuit condition increases the value of current 43 thereby increasing current 49 above the selected first threshold value. Circuit 40 is configured to detect current 49 having the value no less than the first threshold value in combination with the negated control state of IGBT 22, and responsively decouples the DC voltage source for IGBT 22 and from coil 12. For example circuit 41 may detect that the value of current 49 is no less than (or alternately greater than) the first threshold value and assert detect signal 29 resulting in disabling transistor 25 as illustrated by plots 183-184.

Because the first threshold value is lower than the second threshold value, using the first threshold value when IGBT 22 is disabled will more quickly detect the rise in the value of current 49 in response to the short circuit than it would if the second value were used when IGBT 22 were enabled. This operation allows circuit 40 to more rapidly detect the short circuit and more rapidly protect circuit 40. An embodiment may include that circuit 40 may be configured to perform a slow disabling of transistor 25 which may be referred to as a soft shutdown of system 10.

Figure 6:
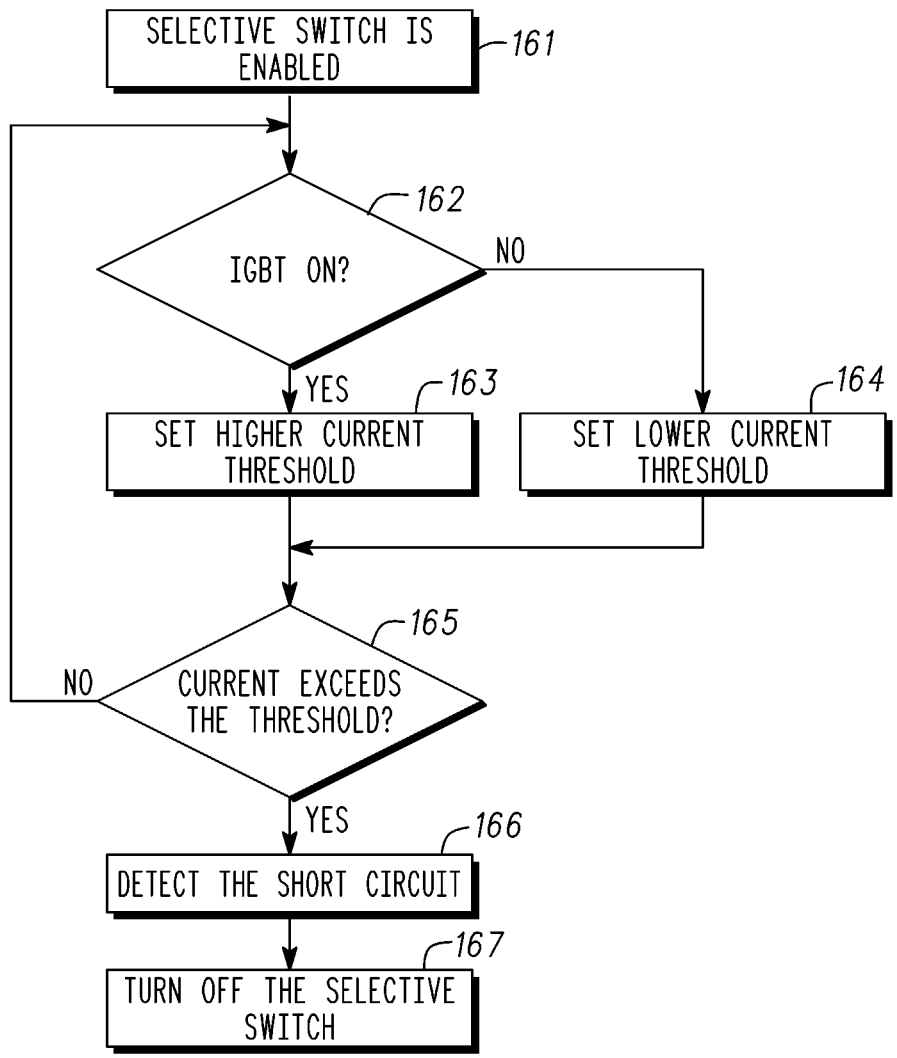
FIG. 6 includes a flow chart illustrating some steps in an example of an embodiment of a method of protecting the igniter circuit of FIG. 4 in accordance with the present invention.

FIG. 6 includes a flow chart 160 illustrating some steps in an example of an embodiment of a method of protecting circuit 40 and or circuit 16. This description has references to FIGS. 4-6. At a step 161, transistor 25 is enabled. In steps 162-164 the threshold value of circuit 40 is selectively set in response to the enabled or disabled control state of IGBT 22, or alternately in response to the asserted or negated state of drive signal 32 or of another control signal that controls the state of IGBT 22. At a step 165, circuit 40 determines if the value of current 49 exceeds the selected threshold value. If not, operation returns to determining and selecting the threshold value. At a step 166, circuit 40 detects the short circuit condition in response to the value of current 49 exceeding the selected threshold value, and circuit 40 responsively disables transistor 25.

Those skilled in the art will appreciate that circuit 40 may also be configured to detect a short circuit condition of IGBT 22 in a similar manner to that described for circuit 16. For example, during the operation of circuit 40 a short of IGBT 22 may result in an increase of currents 23 and 49 which may also be detected by circuit 41. For example, the increased value of current 23 may cause current 49 to be greater than the selected first threshold value as explained for circuit 16.

Those skilled in the art will also appreciate that circuit 41 may be used to replace circuit 28 in an alternate embodiment of circuit 16 of FIG. 1.

Figure 14:
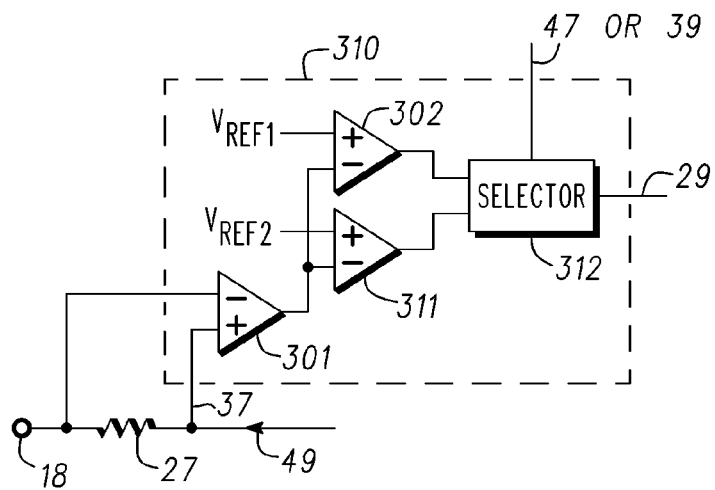
FIG. 14 schematically illustrates an example of an embodiment of a portion of a detect circuit that may be an alternate embodiment of a portion of the circuit of FIG. 1, 4, 7, 8, or 9 in accordance with the present invention.

Referring now to FIG. 14, FIG. 14 schematically illustrates an example of an embodiment of a portion of a detect circuit 310 that may be an alternate embodiment of detect circuit 41 (FIG. 4). An embodiment of circuit 310 may be similar to circuit 300, however circuit 310 includes a comparator 311 and a selector circuit or selector 312. Those skilled in the art will appreciate that circuit 310 may be used instead of circuit 41 (FIG. 4). Comparator 311 receives the signal from amplifier 301 that is representative of signal 37 and asserts the output of comparator 311 in response to signal 37 having a value that is greater than a reference voltage Vref2. The value of Vref2 is greater than the value of Vref1. Selector 312 is configured to select either the output of comparator 302 for the output of comparator 311 in response to the negated or asserted control state of IGBT 22. For example, circuit 312 may be configured to select either the output of comparator 302 for the output of comparator 311 in response to different states of signal 47 or alternately signal 39 or signal 32. In an embodiment, selector 312 is configured to select the output of comparator 302 to an output as signal 29 in response to a negated state of signal 47 and to select the output of comparator 311 to output 29 in response to an asserted state of signal 47.

Figure 7:
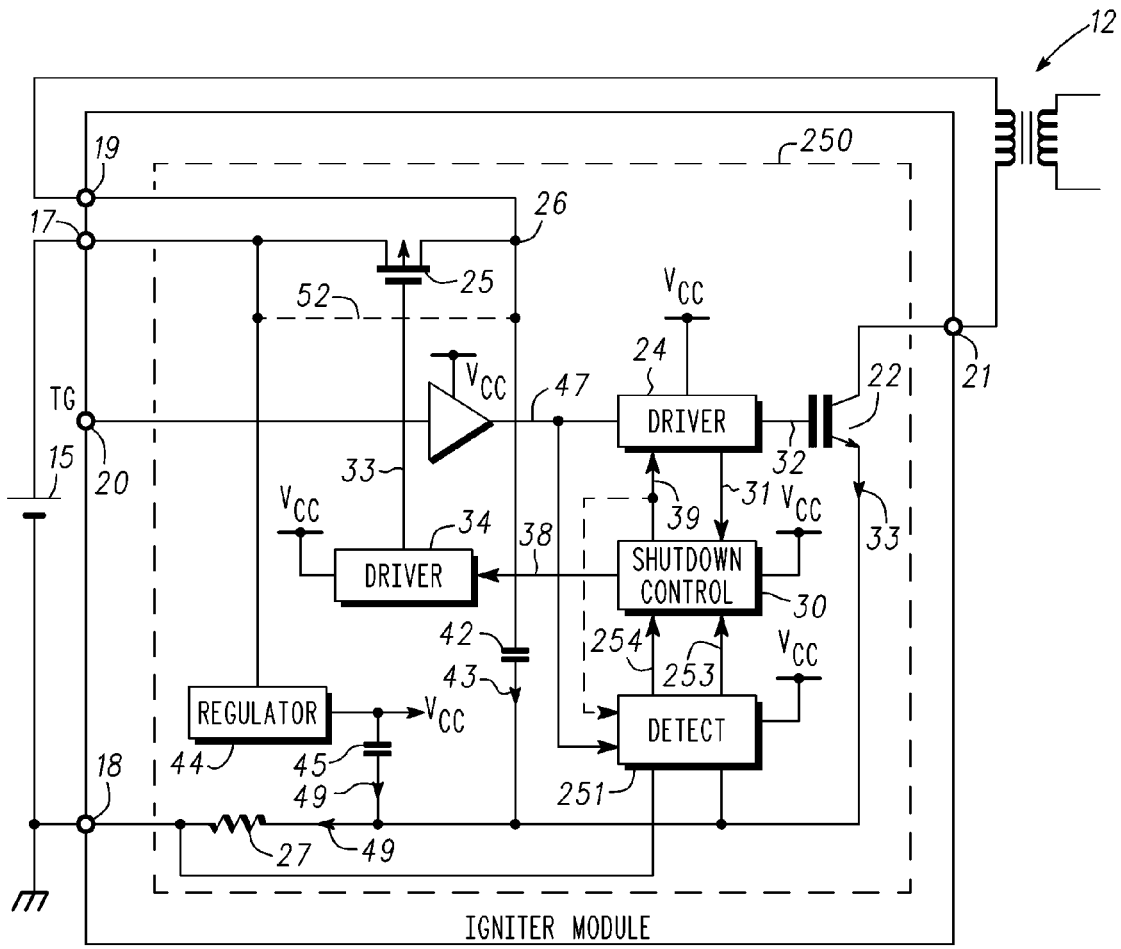
FIG. 7 schematically illustrates an example of an embodiment of a portion of an igniter circuit that may be an alternate embodiment of the igniter circuit of any of FIG. 1 or 4 in accordance with the present invention.

Referring to FIG. 7, FIG. 7 schematically illustrates an example of an embodiment of a portion of an igniter circuit 250 that may be an alternate embodiment of circuit 40 that was described in the description of FIGS. 4-6. Circuit 250 is substantially the same as circuit 40 but circuit 250 includes a detect circuit 251 that may be an alternate embodiment of circuit 41.

An embodiment of circuit 250 may be configured to detect current 49 having a value no less than the second threshold value in response to an asserted control state of IGBT 22. This operation is substantially the same as the operation of circuit 40 in response to the asserted control state of IGBT 22. However, in response to the negated control state of IGBT 22, circuit 250 may be configured to detect current 49 having a value no less than either of or both of the first threshold value and/or the second threshold value. An embodiment may include that circuit 251 is configured to simultaneously detect current 49 having either of the first and/or second threshold values in combination with the negated control state of IGBT 22. Thus, circuit 250 may be configured to selectively select either the second threshold value or the combination of both the first and second threshold values in response to the respective asserted or negated control state of IGBT 22.

In some embodiments, circuit 250 may be configured to detect the current reaching the first threshold value and the second threshold value. For example, if the first threshold is surpassed but the high threshold is not surpassed, circuit 250 may be configured to responsively perform an action, such as the non-limiting example of perform the soft shutdown operation. If both the first and the second threshold values are exceeded, circuit 250 may be configured to perform a different operation. A non-limiting example may include performing a quick shutdown. Thus, circuit 251 may be configured to form two different detect signals. Circuit 251 may be configured to assert a detect signal 253 in response to detecting current 49 having a value no less than the first threshold and configured to assert a detect signal 254 in response to detecting current 49 having a value no less than the second threshold.

For example, assume that IGBT 22 is disabled and that IGBT 22 forms an IGBT short. Because of the inductance of coil 12, the IGBT short may form a current that slowly increase in value. Thus, having circuit 251 configured to selectively detect current 49 having a value that is no less than the first threshold value allows circuit 250 to more quickly detect the IGBT short than if only the second threshold value were used in response to the negated control state of IGBT 22.

For another example, assume that IGBT 22 is disabled and a different short circuit condition occurs that forms a large value for current 49 that is larger than the second threshold value. Circuit 251 may assert detect signal 253 in response to detecting current 49 having a value no less than the first threshold value, and may assert detect signal 254 in response to detecting current 49 having a value no less than the second threshold value. Having circuit 251 configured to selectively detect current 49 having a value that is no less than the first threshold value and the second threshold value allows circuit 250 to perform different protection sequences for the two different value of the current.

Figure 8:
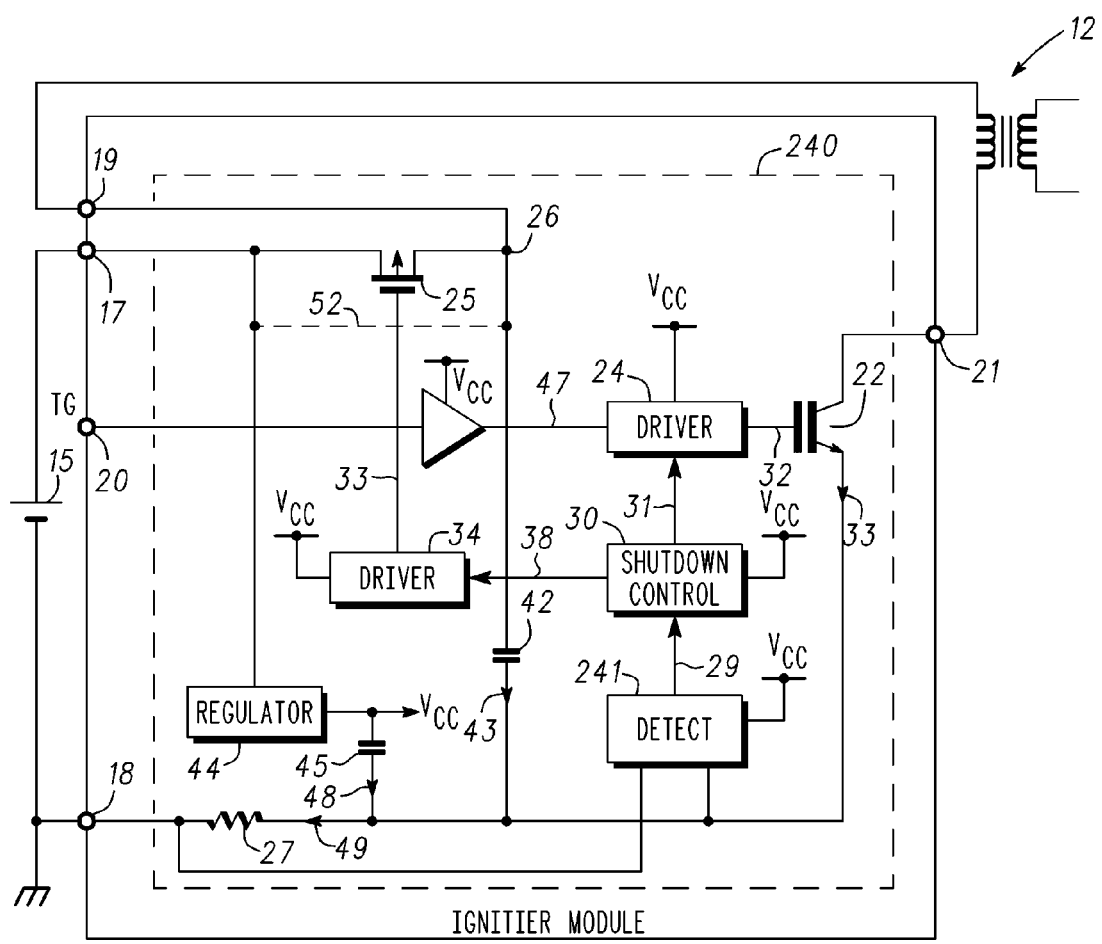
FIG. 8 schematically illustrates an example of an embodiment of a portion of an igniter circuit that may be an alternate embodiment of the igniter circuit of any of FIG. 1 or 4 or 7 in accordance with the present invention.

FIG. 8 schematically illustrates an example of an embodiment of a portion of an igniter circuit 240 that may be an alternate embodiment of circuit 16 that was described in the description of FIGS. 1-3 or of circuit 40 that was described in the description of FIGS. 4-6 or of circuit 250 (FIG. 7). Circuit 240 is substantially the same as circuits 16 or 40 but circuit 240 includes a detect circuit 241. Circuit 241 may be an alternate embodiment of either of circuits 28 or 41 of respective FIGS. 1 and 4 and may be used in either or both of circuits 16 or 40 in addition to or instead of circuits 16 and/or 40.

Circuit 241 is configured to detect the value of current 49 having a value that is no less than the high threshold for all conditions of the control state of IGBT 22, or alternately independently of the control state of IGBT 22. An embodiment of circuit 240 is configured to decouple the DC voltage source from output 19, from coil 12, and from IGBT 22 in response to current 49 having a value that is no less than the second threshold value independently of the control state of IGBT 22.

Using the second threshold for all conditions of the control state of IGBT 22 allows circuit 240 to more quickly react to the short circuit condition and to more accurately provide protection therefor. An embodiment may include that circuit 240 may be configured to perform a quick shutdown of system 10 in response to detecting current 49 having a value that is no less than the second threshold value. The quick shutdown is explained hereinbefore.

Figure 9:
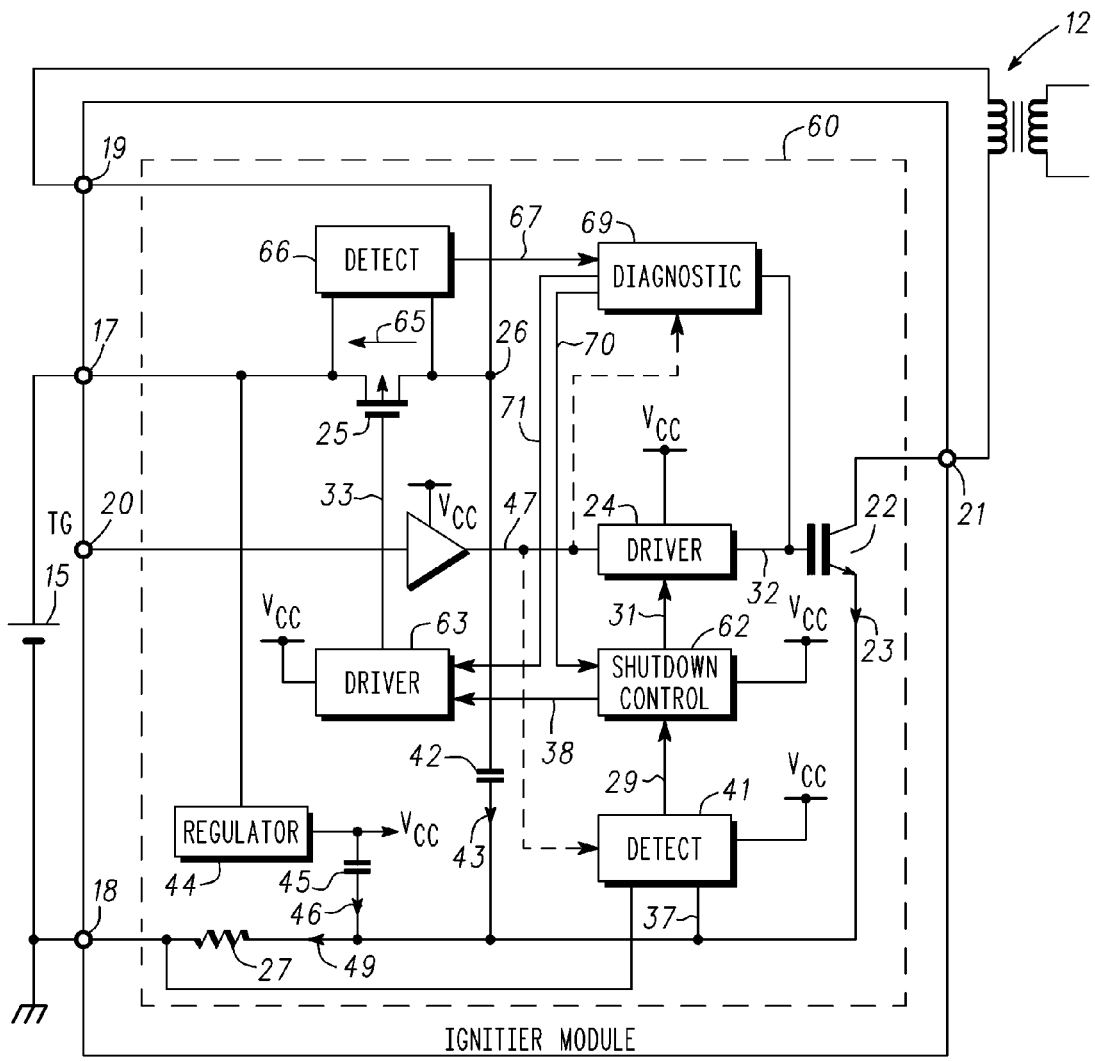
FIG. 9 schematically illustrates an example of an embodiment of a portion of another igniter circuit that may be an alternate embodiment of the igniter circuit of either of FIG. 1 or 4 or 7-8 in accordance with the present invention.

FIG. 9 schematically illustrates an example of a portion of an embodiment of an igniter circuit 60 that may be an alternate embodiment of any of igniter circuits 16, 40, 240, or 250. Circuit 60 may include embodiments that are substantially the same as any of igniter circuits 16, 40, 240, or 250. However, circuit 60 has an embodiment that may include a driver or driver circuit 63, a shutdown control circuit 62, and a diagnostic control circuit. An embodiment of the diagnostic circuit may include a detect circuit 66 and a diagnostic controller circuit or diagnostic circuit 69. Circuit 63 is substantially the same as circuit 34 except that circuit 63 is configured to negate transistor 25 in response to a failed condition of transistor 25. An embodiment may include that circuit 63 is configured to negate transistor 25 in response to a signal 71 from control circuit 69 in addition to signal 38. Circuit 62 is substantially the same as circuit 30 except that circuit 62 is configured to assert control signal 38 in response to a control signal 70 from circuit 69 in addition to asserting signal 38 in response to detect signal 29 from circuit 41. Those skilled in the art will appreciate that circuit 41 may be replaced by circuit 28, or 241, or 251 in some embodiments.

An embodiment of circuit 66 together with circuit 69 may be configured to detect a failure of transistor 25 and responsively disable IGBT 22, some embodiments of circuit 66 may optionally be configured to also disable transistor 25. Some embodiments of circuit 66 may also be configured to latch the disabled state of IGBT 22. A non-limiting example of latching the state is explained in the description of FIG. 13. A voltage 65 formed across transistor 25 is illustrated by an arrow. An embodiment of circuit 66 may be configured to monitor the state of transistor 25 and assert a switch failed signal 67 in response to voltage 65 having a value no greater than a first diagnostic threshold. In an alternate embodiment, circuit 66 may be configured to monitor the value of the voltage on node 26 and assert the switch failed signal in response to the node 26 voltage decreasing to less than a second diagnostic threshold that is representative of the first diagnostic threshold for voltage 65. Circuit 60 and/or control circuit 69 may be configured to selectively disable transistor 25 to facilitate detection of the failure. Circuit 60 and/or circuit 69 may also be configured to assert a diagnostic failed signal 70 in response to detecting the failure of transistor 25.

Figure 10:
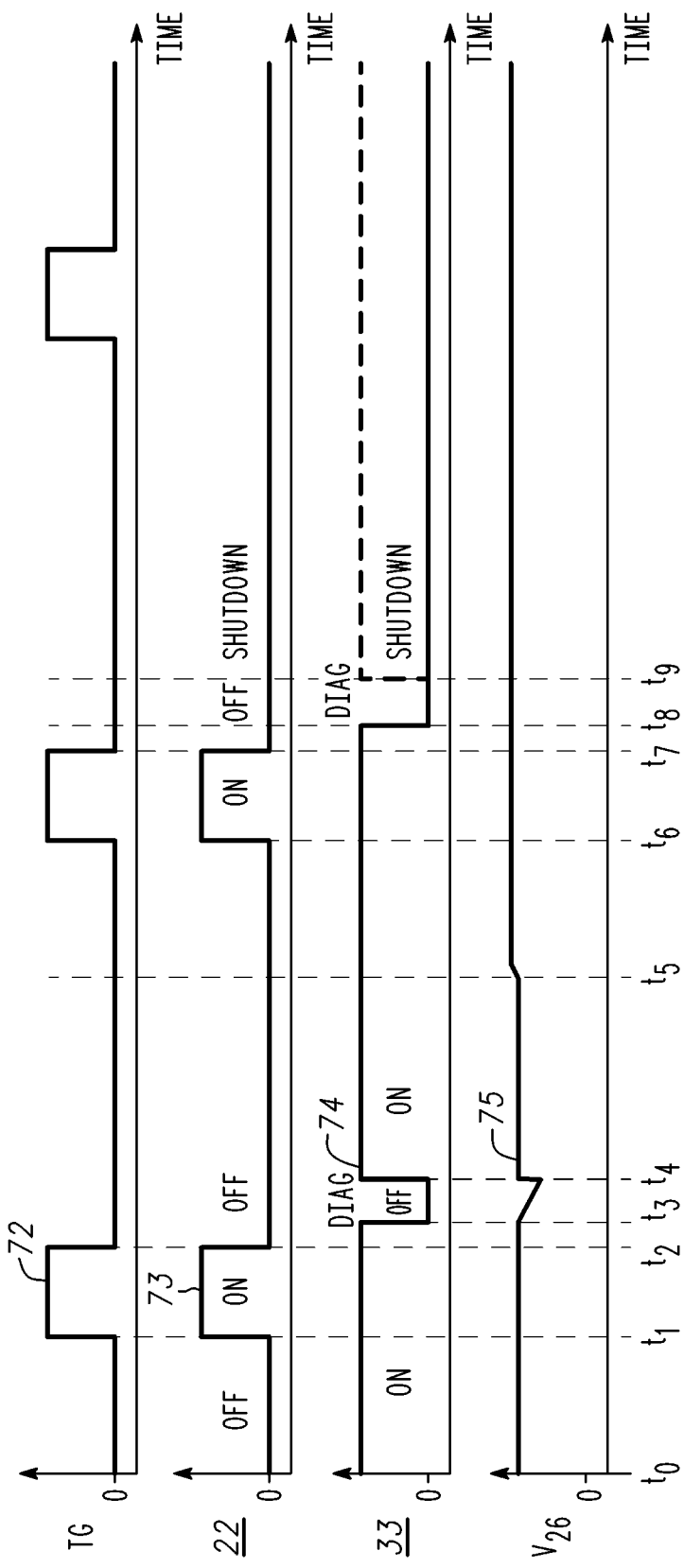
FIG. 10 is a graph illustrating examples of embodiments of some signals that may be formed during some of the operations of the igniter circuit of FIG. 7 in accordance with the present invention.

FIG. 10 is a graph having plots illustrating example embodiments of some signals that may be formed during the operation of some example embodiments of circuit 60. A plot 72 illustrates the trigger (TG) signal, and a plot 73 illustrates the enabled or disabled state of IGBT 22. A plot 74 illustrates the control state of transistor 25 such as for example the state of a signal that is representative of drive signal 33, and a plot 75 illustrates the value of the voltage at node 26 relative to input 18. This description has references to FIGS. 9-10.

Assume that at a time t0 circuit 60 is operating normally, IGBT 22 is disabled, transistor 25 is enabled, and voltage 65 has a value. Those skilled in the art will appreciate that in an embodiment the value may be influenced by the ON resistance (Rdson) of transistor 25 and the value of the current flowing through transistor 25. For this condition, the voltage on node 26 may have a corresponding value as illustrated by plots 74 and 75. Assume that at a time t1 circuit 60 receives an asserted state of the trigger signal and enables IGBT 22 as illustrated by plots 72-73. At a time t2, the trigger signal is negated and IGBT 22 is disabled. Control circuit 69 receives the negated drive signal 32, or a signal that is representative thereof such as for example signal 39 or 47, and asserts a high side disable signal 71 at a time t3. Circuit 63 receives the asserted state of signal 71 and responsively disables transistor 25 as illustrated by plot 74. Detect circuit 66 monitors the value of voltage 65. After transistor 25 is disabled, if transistor 25 is operating correctly the value of voltage 65 has a value that increases to be greater than the first diagnostic threshold value thus circuit 66 negates signal 67. Correspondingly, the voltage at node 26 may decrease to a value less than the corresponding second diagnostic threshold value as indicated between times t3 and t4. Control circuit 69 receives the negated state of signal 67 and the negated control state of IGBT 22, such as the drive signal 32, and responsively negates signal 70 to allow IGBT 22 to be enabled such as by the trigger signal. Also, in response to the negated state of signal 67, control circuit 69 negates signal 71 to allow driver 63 to re-enable transistor 25 as illustrated by plot 74 at a time t4.

Assume that at a time t5, transistor 25 is enabled, IGBT 22 is disabled, and transistor 25 fails. In some embodiments, the voltage at node 26 may increase in response to the failure as illustrated by plot 75 at time t5. For example, if transistor 25 fails in a shored condition the voltage at node 26 may increase. Those skilled in the art will appreciate that in some embodiments the increase may be very small, for example the Rdson of transistor 25 may become very small. At a time t6, the trigger (TG) signal may be asserted to again enable IGBT 22 as illustrated by plot 72. At a time t7, the trigger (TG) signal is negated and IGBT 22 is disabled. Subsequently, circuit 69 again asserts high side disable signal 71 in order to test transistor 25. In an embodiment, circuit 69 may be configured to assert signal 71 in response to receiving the negated control state of IGBT 22, such as a signal representative of drive signal 32. Driver 63 responsively disables drive signal 33 to transistor 25 and disables transistor 25 as illustrated at time t8. Due to the failure of transistor 25, the value of voltage 65 does not substantially increase even though transistor 25 is disabled. In an alternate embodiment, the voltage on node 26 may not substantially decrease. Detect circuit 66 detects that voltage 65 has a value that is no greater than (or alternately less than) the first diagnostic threshold value, or alternately that the node 26 voltage is no less than the second diagnostic threshold voltage, and therefore asserts diagnostic failed signal 67. In response to the asserted state of signal 67 and the negated state of drive signal 32, control circuit 69 asserts signal 70. Circuit 62 responsively asserts drive disable signal 31 to prevent the trigger signal from enabling IGBT 22. The asserted state of signals 70 and 71 are maintained to continue the disable state of transistor 25 and IGBT 22 thereby preventing damage to circuit 60.

Figure 11:
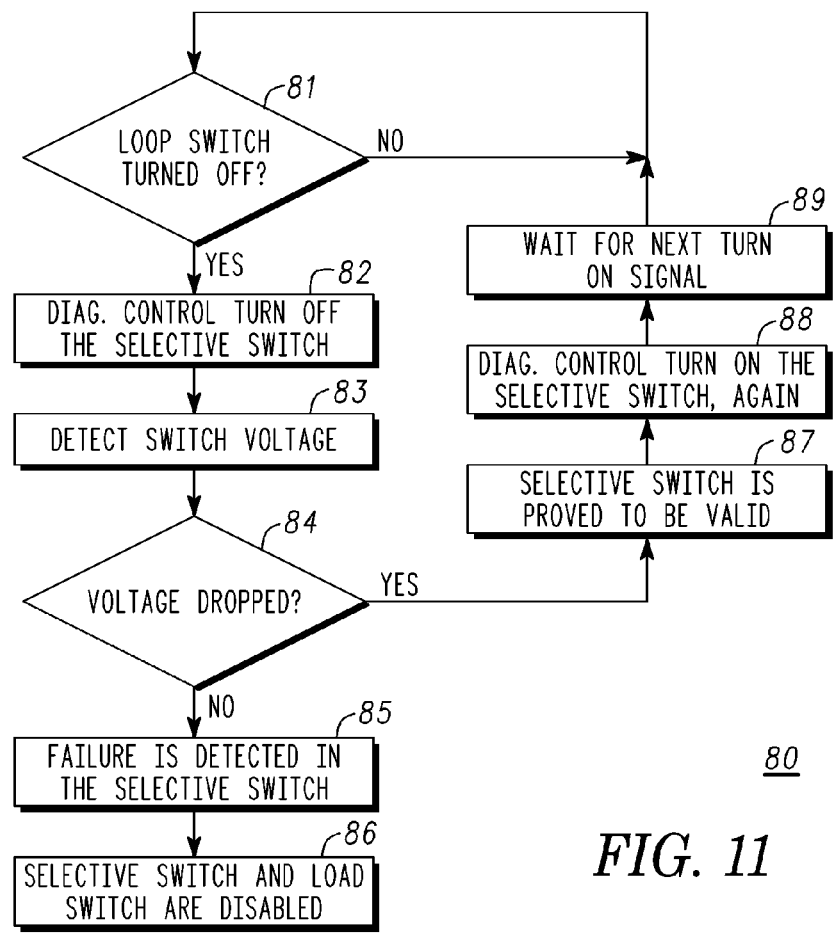
FIG. 11 includes a flow chart illustrating some steps in an example of an embodiment of a method of protecting the igniter circuit of FIG. 7 in accordance with the present invention.

FIG. 11 includes a flowchart 80 that illustrates some steps in a portion of an embodiment of a method of detecting a failure of the selectively enabled switch device, such as for example transistor 25. At a step 81 the method determines that the load switch, such as for example IGBT 22, is disabled. At a step 82, the method may include selectively disabling transistor 25 while IGBT 22 is disabled. While IGBT 22 is disabled, transistor 25 may be briefly disabled without causing an interruption in the operation of circuit 60. At a step 83, the method determines if voltage 65 has increased to no less than the first diagnostic threshold value in response to disabling transistor 25 or alternately if the voltage at node 26 has substantially not decreased. At a step 84, if voltage 65 has substantially not increased in response to disabling transistor 25, or alternately is less than the diagnostic threshold voltage, the method determines that transistor 25 may have failed as indicated at step 85. At step 86, transistor 25 and IGBT 22 are disabled to prevent damage to circuit 60. Those skilled in the art will appreciate that in an alternate embodiment, step 86 may only disable IGBT 22 and not transistor 25, thus, circuit 60 may be configured to only disable IGBT 22 and not transistor 25 or vice versa.

If at step 84 voltage 65 has increased to no less than the first diagnostic threshold or alternately the node 26 voltage has decreased to less than the second diagnostic threshold, the method proceeds to step 87 where it is determined that the selectively enabled switch device has not failed. At step 88, the selectively enabled switch device, such as for example transistor 25, is again enabled to continue normal operation. At step 89, the method continues to wait for another signal to enable the load switch, such as for example IGBT 22.

Figure 15:
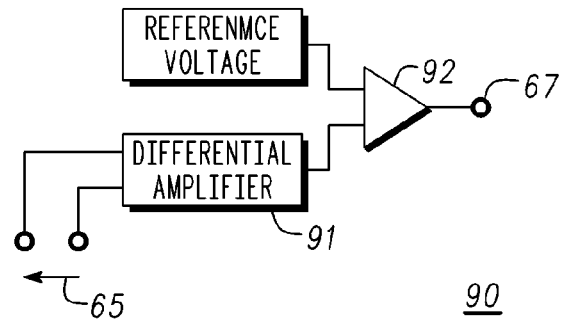
FIG. 15 schematically illustrates an example of an embodiment of a portion of another detect circuit that may be an alternate embodiment of a portion of a circuit of at least FIG. 9 in accordance with the present invention.

Referring now to FIG. 15, FIG. 15 schematically illustrates an example of an embodiment of a portion of a detect circuit 90 that may be an alternate embodiment of circuit 66. Circuit 90 includes a differential amplifier 91 that is configured to monitor the value of voltage 65. A comparator 92 detects if the value of voltage 65 exceeds a reference voltage that is representative of the diagnostic threshold value.

Figure 16:
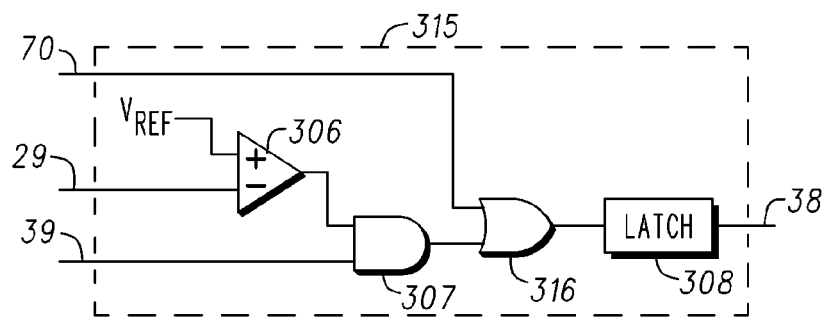
FIG. 16 schematically illustrates an example of an embodiment of a portion of another shutdown control circuit that may be an alternate embodiment of a portion of a circuit of at least FIG. 9 in accordance with the present invention.

FIG. 16 schematically illustrates an example of an embodiment of a portion of a shutdown a control circuit 315 that may be an alternate embodiment of circuit 62 (FIG. 9). In some embodiments, circuit 315 may be similar to circuit 305 (FIG. 13) but circuit 315 also includes an OR gate 316. Gate 316 is inserted between gate 307 and latch 308. A first input of gate 316 is connected to receive the output of gate 307 and a second input of gate 316 is connected to receive signal 70 from circuit 69 (FIG. 9). An output of gate 316 is connected to set latch 308.

Figure 17:
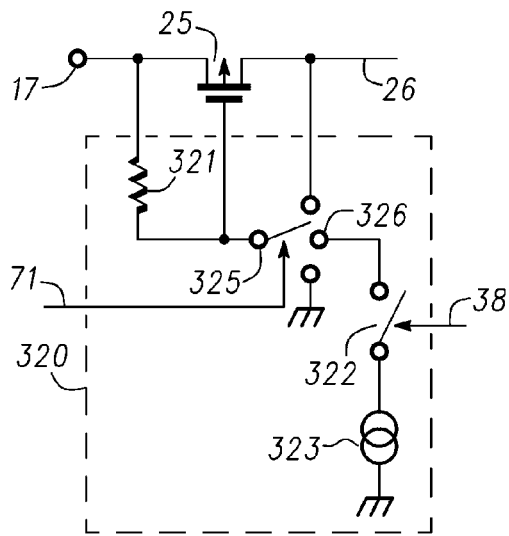
FIG. 17 schematically illustrates an example of an embodiment of a portion of a driver circuit that may be an alternate embodiment of a portion of the circuit of at least FIG. 9 in accordance with the present invention.

FIG. 17 schematically illustrates an example of an embodiment of a portion of a driver circuit 320 that may be an alternate embodiment of circuit 63 (FIG. 9). Circuit 320 includes a current source 323, a first switch 322, a control switch or second switch 325, and an isolation resistor 321. In an embodiment, signal 71 may be configured to have a plurality of values or states that may be configured to selectively control switch 325 to switch between the three positions illustrated. For example, signal 71 may include two or more different signal lines that can form a plurality of digital states to selectively control switch 325. For example, signal 71 may be configured as a 2-bit control bus to form the plurality of digital states. An embodiment of switch 325 may be configured as two or more transistors that are controlled by the digital states of the two or more signal lines. In other embodiments, signal 71 may be an analog signal that has three of more values to selective control switch 325. In normal operation to enable transistor 25, signal 38 is negated and the signal 71 is formed to have a first state of value. The negated state of signal 38 closes switch 322 and connects current source 323 to a node 326. The first state or value of signal 71 allows switch 325 to selectively close and selectively connect node 326, thus current source 323, to the gate of transistor 25 in order to provide a drive signal to enable transistor 25. During the diagnostic operation mode, signal 38 may remain negated such that switch 322 remains closed connecting current source 323 to node 326. However, circuit 69 controls signal 71 during at least a portion of the diagnostic mode. An embodiment of signal 71 may include a second state or value that selectively controls switch 325 to selectively connect the gate of transistor 25 to node 26. When switch 325 is connected to node 26, the gate voltage of transistor 25 is held at a high voltage that disables transistor 25. For example switch 325 may be configured to connect the gate of transistor 25 to node 26 or the source of transistor 25 in response to the asserted second state or value of signal 71 to disable transistor 25. Alternately, transistor 25 may be configured to node 26 for the quick shutdown mode.

When the switch 325 is connected to the bottom terminal, the gate voltage of transistor 25 is tied low and resistor 321 and the gate capacitance of transistor 25 do not form a filter. Thus transistor 25 may be enabled very quickly. For example, circuit 320 may be configured to connect switch 325 to the bottom node in response to the end of the diagnostic mode, such as illustrated at t4 (FIG. 10) to recover the voltage on node 26. An embodiment may include that signal 71 has a third state or value that may be configured to selectively connect the gate of transistor 25 to the bottom terminal.

When the switch 325 is connected to the middle terminal and switch 322 is enabled, current source 323 is controlled to adjust the gate voltage of transistor 25 low enough to be enabled, but still greater than ground. For example, current source 323 may form the gate voltage to be substantially at or just slightly greater than the threshold voltage of transistor 25. This may be a way to shorten the disabling time of transistor 25.

Figure 18:
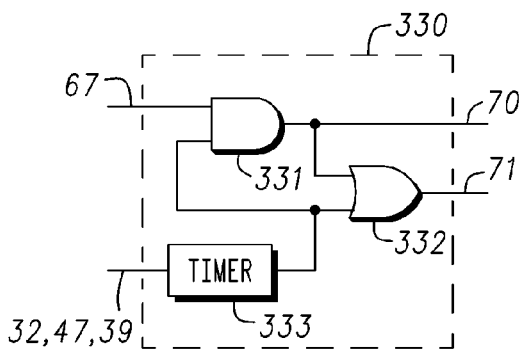
FIG. 18 schematically illustrates an example of an embodiment of a portion of a diagnostic circuit that may be an alternate embodiment of a portion of a circuit of at least FIG. 9 in accordance with the present invention.

FIG. 18 schematically illustrates an example of an embodiment of a portion of a diagnostic circuit 330 that may be an alternate embodiment of diagnostic circuit 69 (FIG. 9). In response to the negated control state of IGBT 22 circuit 330 is configured to assert signal 71 to disable transistor 25 for a time interval and to negate signal 71 after the time interval. An embodiment of circuit 330 may be configured to assert signal 67 after the time interval in response to the failed condition of transistor 25, and to responsively disable IGBT 22 and optionally to also disable transistor 25. For example, if signal 67 is asserted at the termination of the time interval circuit 330 asserts signal 70 to cause circuit 62 and circuit 24 to disable IGBT 22 and to again assert (or maintain asserted) signal 71 to disable transistor 25. Circuit 330 includes a timer 333 that is configured to initiate the time interval in response to receiving a signal indicating the negated control state of IGBT 22. The duration of the time interval is selected to be sufficient to allow voltage 65 to increase to no less than the diagnostic threshold value if transistor 25 is operating normally. Timer 333 has an input connected to one of signals 32, or 39, or 47 in order to receive a signal indicating the negated control state of IGBT 22.

An output of timer 333 is asserted during the time interval and is otherwise negated. Circuit 330 includes an AND gate 331 having a first input connected to receive signal 67 and a second input configured to receive the output of timer 333.

An output of gate 331 is connected to form signal 70. Circuit 330 also includes an OR gate 332 having a first input connected to receive the output of gate 331 and a second input connected to receive the output of timer 333. An output of gate 332 is connected to signal 71.

Figure 19:
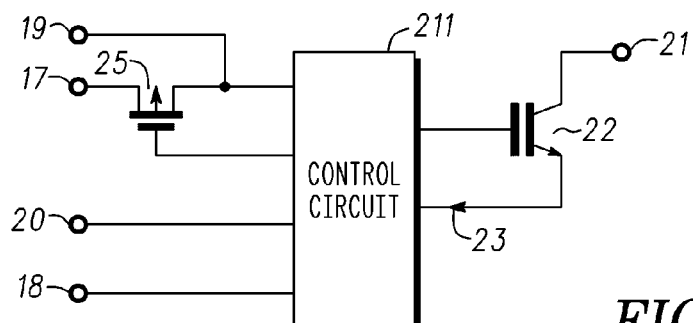
FIG. 19 schematically illustrates an example of an embodiment of a portion of another igniter circuit that may have embodiments that operate and function similarly to any or all of the igniter circuits of FIGS. 1, 4, and/or 7-9 in accordance with the present invention.

FIG. 19 schematically illustrates an example of an embodiment of a portion of an igniter circuit 211 that has an embodiment that is configured to decouple the DC voltage source from IGBT 22, such as the non-limiting example of disabling transistor 25, in response to the combination of an IGBT short or alternately a short circuit condition causing a current greater than the first threshold and the negated control state of IGBT 22. For example, circuit 211 may include circuits that function similarly to the combination of circuits 24, 28, 30, and 34 of circuit 16 (FIG. 1). In an embodiment, circuit 210 may be configured to decouple the DC voltage source from IGBT 22 in response to the asserted control state of IGBT 22 in combination with the current exceeding the second threshold and to also decouple the DC voltage source from IGBT 22 in response to the combination of the current exceeding the first threshold and the negated control state of IGBT 22. For example, circuit 210 may include control circuits that function similarly to the combination of circuits 24, 30, 34, and 251 of circuit 250 (FIG. 4). In another embodiment, circuit 210 may be configured to decouple IGBT 22 from the DC voltage source in response to the combination of the current exceeding the second threshold and the asserted control state of IGBT 22 and to also decouple the DC voltage source in response to the current exceeding either the first or the second threshold in combination with the negated state of IGBT 22. For example, circuit 211 may include control circuits that function similarly to the combination of circuits 24, 30, 34, and 251 of circuit 250 (FIG. 7). Another embodiment of circuit 210 may be configured to decouple the DC voltage source from IGBT 22 in response to the current greater than the second threshold independently of the control state of IGBT 22. For example, circuit 211 may include control circuits that function similarly to the combination of circuits 24, 30, 34, and 241 of circuit 240 (FIG. 8). Circuit 210 may also include a diagnostic circuit that is configured to determine if transistor 25 has failed and to responsively disable IGBT 22 and transistor 25 in response to the failed condition. For example, circuit 211 may include circuits that function similarly to the combination of circuits 24, 41, 62, 63, 66, and 69 of circuit 60 (FIG. 9).

Figure 20:
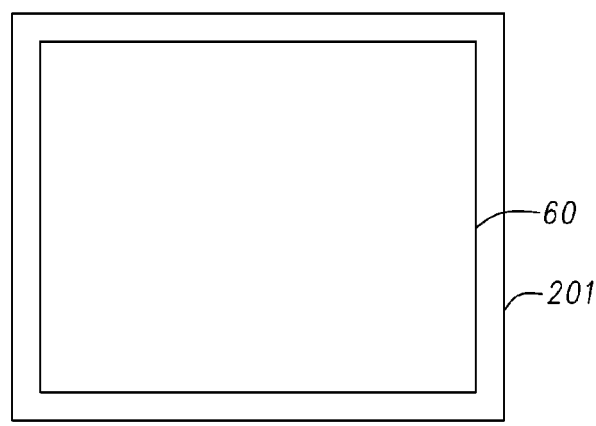
FIG. 20 illustrates an enlarged plan view of an embodiment of a semiconductor device that may include any one of the igniter circuits of FIG. 1, 4, or 7-9 in accordance with the present invention.

FIG. 20 illustrates an enlarged plan view of a portion of an embodiment of a semiconductor device or integrated circuit 200 that is formed on a semiconductor die 201. In an embodiment, any one of igniter circuits 16, 40, 60, 240, or 250 may be formed on die 201. Die 201 may also include other circuits that are not shown in FIG. 20 for simplicity of the drawing. Igniter circuit 16, 40, 60, 240, or 250 may be formed on die 201 by semiconductor manufacturing techniques that are well known to those skilled in the art.

From all the foregoing, one skilled in the art will appreciate that an embodiment of an igniter circuit may comprise:

an output, such as for example output 19, configured for coupling to a primary side of an ignition coil, such as for example coil 12;

a circuit, such as for example circuit 40, configured to form a drive signal, signal 32 for a non-limiting example, to control a load switch, such as IGBT 22 for example, to control a load current, such as for example current 23, through the load switch;

a selectively enabled switch, transistor 25 for a non-limiting example, configured to receive a DC voltage, such as for example the voltage from input 17, and selectively couple or decouple the DC voltage to an internal node, node 26 or 51 for a non-limiting example, and to the output;

a first circuit, such as for example either of circuits 16 or 24 or 40 or 60 for example, configured to selectively enable or disable the load switch;

a second circuit, either of circuits 16 or 28 or 40 or 41 or 60 for example, configured to monitor a load current, such as for example current 23, through the load switch and detect the load current having a first value that is no less than a threshold value; and a third circuit, any one of circuits 16 or 30 or 40 or 60 or 62 for example, configured to disable the selectively enabled switch and the load switch in response to the combined conditions of the first circuit forming a signal, such as for example the drive signal for a non-limiting example, to disable the load switch and the second circuit detecting that the load current is no less than the threshold value.

An embodiment may include that the igniter circuit may also include a diagnostic circuit, such as for example either of or both of circuits 66 and/or 69, configured to detect a failure, such as the non-limiting example of a shorted failure, of the selectively enabled switch and to responsively disable the load switch.

Another embodiment may include that the igniter circuit may also include a diagnostic circuit, such as for example either of or both of circuits 66 and/or 69, configured to disable the selectively enabled switch in response to disabling the load switch, and to disable the load switch and the selectively enabled switch in response to a voltage drop across the selectively enabled switch having a value, while the selectively enabled switch is disabled, that is greater than a diagnostic threshold value.

An embodiment may include that the second circuit may be configured to selectively set the threshold value to a first threshold value in response to a first state of the signal and to set the threshold value to a second threshold value in response to a second state of the signal.

In an embodiment, the diagnostic circuit may be configured to also disable the selectively enabled switch in response to the voltage drop across the selectively enabled switch having the value, while the selectively enabled switch is disabled.

Another embodiment may include a detect circuit configured to detect a voltage at an output of the selectively enabled switch having a value that is less than a diagnostic threshold value during a time interval that the load switch is disabled, and responsively assert a switch failed signal.

An embodiment of the detect circuit may include an amplifier configured to monitor a voltage drop across the selectively enabled switch and a comparator configured to compare an output of the amplifier to a reference value.

An embodiment of the diagnostic circuit may include a diagnostic controller circuit configured to form the time interval and to disable the selectively enabled switch in response to expiration of the time interval and receiving an asserted state of the switch failed signal.

In an embodiment, the diagnostic controller circuit may include a timer circuit configured to initiate the time interval in response to a negated control state of the load switch, the diagnostic circuit including a logic circuit having an output coupled to disable the selectively enabled switch in response to expiration of the time interval and a voltage at an output of the selectively enabled switch having a value that is no greater than a diagnostic threshold value.

The third circuit may have an embodiment that includes a control switch configured to selectively couple a control electrode of the selectively enabled switch to one of a current source or to a common return voltage to enable the selectively enabled switch, or to couple the control terminal to a current carrying electrode of the electively enabled switch to disable the electively enabled switch.

Those skilled in the art will appreciate that a method of forming an igniter circuit may comprise:

configuring the igniter circuit to receive a DC voltage from a DC voltage source;

configuring the igniter circuit to selectively enable a first switch, such as for example transistor 25, to couple the DC voltage to an output, such as for example output 19, of the igniter circuit, wherein the output is configured for coupling to a primary side of an ignition coil;

configuring the igniter circuit to control a state of a load switch, switch 22 for a non-limiting example, to control a load current, such as for example current 23, through the load switch;

configuring the igniter circuit to selective set a threshold value of the load current;

configuring the igniter circuit to selectively disable the load switch in response to a value of the load current exceeding the threshold value; and configuring the igniter circuit to selectively disable the load switch in response to detecting a failed condition of the first switch.

An embodiment of the method may also include configuring the igniter circuit to disable the first switch in response to the load current exceeding the threshold value.

The method may have an embodiment that includes configuring the igniter circuit to selectively disable the load switch in response to a voltage across the first switch having a value that is less than a diagnostic threshold value while the first switch is disabled.

An embodiment of the method may include configuring the igniter circuit to selectively disable the first switch in addition to the load switch.

In an embodiment the method may include configuring the igniter circuit to selectively disable the load switch includes configuring a diagnostic circuit to disable the first switch in response to a negated control state of the load switch and to detect a voltage on an output of the first switch having a value no greater than a diagnostic threshold value.

The method may have an embodiment that includes configuring the igniter circuit to selective set the threshold value of the load current in response to an asserted control state or negated control state of the load switch.

Those skilled in the art will also appreciate that an embodiment of a method of forming an igniter circuit may comprise:

configuring the igniter circuit to enable a first switch to couple a DC voltage source to an output that is configured for coupling to a primary side of an ignition coil;

configuring the igniter circuit control a load switch to form a load current through the ignition coil; and configuring the igniter circuit to determine a failure of the first switch and to responsively disable the load switch.

In an embodiment, the method may also include configuring the igniter circuit to detect a voltage on an output of the first switch having a value different from a diagnostic threshold value during a time interval wherein the first switch is disabled.

An embodiment of the method may also include configuring the igniter circuit to disable the load switch and addition to the first switch.

Another embodiment the method may include configuring the igniter circuit to detect a voltage drop across the first switch having a value less than the diagnostic threshold value.

In an embodiment, the method may include the igniter circuit to disable the load switch in response to the combination of expiration of the time interval and detecting the voltage drop across the first switch having the value less than the diagnostic threshold value.

Those skilled in the art will appreciate that a method of forming an igniter circuit may comprise:

configuring the igniter circuit to receive a DC voltage from a DC voltage source, such as for example from input 17 that may be configured to receive a voltage from source 15;

configuring the igniter circuit to selectively enable a first switch, transistor 25 in a non-limiting example, to couple the DC voltage to an output, such as for example output 19, of the igniter circuit and to a battery capacitor, such as for example capacitor 42, wherein the output is configured for coupling to a primary side of an ignition coil such as for example output 19;

coupling the battery capacitor to an output of the first switch, such as to the drain of transistor 25 for a non-limiting example;

configuring the igniter circuit to control a state of a drive signal, such as for example signal 32, to enable and disable a load switch, switch 22 for a non-limiting example, to control a load current, such as for example current 23, through the load switch;

configuring the igniter circuit to selective set a threshold value in response to an asserted state or negated state of the drive signal; and configuring the igniter circuit to selectively disable the load switch and the first switch in response to a value of a current through the battery capacitor exceeding the threshold value, and configuring the igniter circuit to selectively disable the load switch and the first switch in response to the load current being no less than one of the threshold value or another threshold value.

Another embodiment of the method may include configuring the igniter circuit to disable the first switch in response to disabling the load switch, and to disable the load switch and the first switch in response to a voltage across the first switch having a value that is less than a diagnostic threshold value.

In an embodiment, the method may also include configuring the igniter circuit to selectively disable the load switch and the first switch in response to a voltage across the first switch having a value that is less than a diagnostic threshold value while the first switch is disabled.

Those skilled in the art will appreciate that another embodiment of a method of forming an igniter circuit may comprise:

configuring the igniter circuit to enable a first switch, transistor 25 for a non-limiting example, to couple a DC voltage source to an output, such as output 19 for example, that is configured for coupling to a primary side of an ignition coil;

configuring the igniter circuit to enable a load switch, switch 22 for a non-limiting example, to form a load current, such as for example current 23, through the ignition coil;

configuring the igniter circuit to disable the first switch and decouple the DC voltage source from the ignition coil in response to the load current exceeding a threshold value; and configuring the igniter circuit to one of determine a shorted state of the first switch and to responsively disable the load switch, or to determine a shorted state of a battery capacitor coupled to the first switch and responsively decouple the DC voltage source from the ignition coil.

Another embodiment of the method may include configuring the igniter circuit to disable the first switch, and further including configuring the igniter circuit to disable the load switch.

In view of all of the above, it is evident that a novel device and method is disclosed. Included, among other features, is forming an igniter circuit that includes structure and a method of protecting the igniter circuit. Forming the igniter circuit to detect the shorted condition of the selectively enabled switch and/or the load switch assists in protecting the igniter circuit from the failure of the load switch. Configuring the igniter circuit to detect a short to the DC power source and decouple the load switch form the DC power source also assists in protecting the igniter circuit. Configuring the igniter circuit to detect that the value of current through the load switch has increased past a threshold value and responsively decouple or substantially disconnect the load switch from the DC voltage source facilitates protecting the igniter circuit. Configuring the igniter circuit to detect a short circuit in a battery capacitor or/and in a VCC capacitor also protects the igniter circuit from the failure of the capacitor(s), such as for example capacitors placed between the power supply and the common return. Configuring the igniter circuit to detect that the value of current through the battery capacitor has increased past a threshold value and responsively decouple or substantially disconnect the capacitor(s) from the DC voltage source also assists in protecting the igniter circuit. Configuring the igniter circuit to detect a shorted condition of the selectively enabled switch and responsively disable the load switch, and in some embodiments the selectively enabled switch, also provides protection for the igniter circuit and/or the system.

While the subject matter of the descriptions are described with specific preferred embodiments and example embodiments, the foregoing drawings and descriptions thereof depict only typical and non-limiting examples of embodiments of the subject matter and are not therefore to be considered to be limiting of its scope, it is evident that many alternatives and variations will be apparent to those skilled in the art. As will be appreciated by those skilled in the art, the example form of system 10 and circuits 16, 40, 60, 240 and 250 are used as a vehicle to explain the operation method of detecting the failures in the load switch, and capacitors(s), and selectively enabled switch device. Any of circuits 16, 40, 60, 240 or 250 may be configured with various other embodiments in addition to the embodiments illustrated in the drawings as long as the circuits can detect a the described short and selective disable the selectively enabled switch device, and/or detect a shorted condition of the battery or VCC capacitors and selective disable the selectively enabled switch device, and/or detect a shorted condition of the selectively enabled switch device and responsively disable the load switch, and/or in some embodiments the selectively enabled switch.

As the claims hereinafter reflect, inventive aspects may lie in less than all features of a single foregoing disclosed embodiment. Thus, the hereinafter expressed claims are hereby expressly incorporated into this Detailed Description of the Drawings, with each claim standing on its own as a separate embodiment of an invention. Furthermore, while some embodiments described herein include some but not other features included in other embodiments, combinations of features of different embodiments are meant to be within the scope of the invention, and form different embodiments, as would be understood by those skilled in the art.

The invention claimed is:

1. An igniter circuit comprising:
   an output configured for coupling to a primary side of an ignition coil;
   a first circuit configured to form a drive signal to selectively enable or disable a load switch to control a load current through the load switch;
   a selectively enabled switch configured to receive a DC voltage and selectively couple or decouple the DC voltage to an internal node and to the output;
   a second circuit configured to monitor a load current through the load switch and detect the load current having a first value that is no less than a threshold value;
   a third circuit configured to disable the selectively enabled switch in response to the combined conditions of the first circuit forming a signal to disable the load switch and the second circuit detecting that the load current is no less than the threshold value; and
   a diagnostic circuit configured to detect a failure of the selectively enabled switch and to responsively disable the load switch.

2. The igniter circuit of claim 1 further including the diagnostic circuit configured to disable the selectively enabled switch in response to disabling the load switch, and to disable the load switch in response to a voltage drop across the selectively enabled switch having a value, while the selectively enabled switch is disabled, that is greater than a diagnostic threshold value.

3. The igniter circuit of claim 2 wherein the diagnostic circuit is configured to also disable the selectively enabled switch in response to the voltage drop across the selectively enabled switch having the value, while the selectively enabled switch is disabled.

4. The igniter circuit of claim 1 wherein the second circuit is configured to selectively set the threshold value to a first threshold value in response to a first state of the signal and to set the threshold value to a second threshold value in response to a second state of the signal.

5. The igniter circuit of claim 1 wherein the diagnostic circuit includes a detect circuit configured to detect a voltage at an output of the selectively enabled switch having a value that is less than a diagnostic threshold value during a time interval that the load switch is disabled, and responsively assert a switch failed signal.

6. The igniter circuit of claim 5 wherein the detect circuit includes an amplifier configured to monitor a voltage drop across the selectively enabled switch and a comparator configured to compare an output of the amplifier to a reference value.

7. The igniter circuit of claim 5 wherein the diagnostic circuit includes a diagnostic controller circuit configured to form the time interval and to disable the selectively enabled switch in response to expiration of the time interval and receiving an asserted state of the switch failed signal.

8. The igniter circuit of claim 7 wherein the diagnostic controller circuit includes a timer circuit configured to initiate the time interval in response to a negated control state of the load switch, the diagnostic circuit including a logic circuit having an output coupled to disable the selectively enabled switch in response to expiration of the time interval and a voltage at an output of the selectively enabled switch having a value that is no greater than a diagnostic threshold value.

9. The igniter circuit of claim 1 wherein the third circuit includes a control switch configured to selectively couple a control electrode of the selectively enabled switch to one of a current source or to a common return voltage to enable the selectively enabled switch, or to couple the control terminal to a current carrying electrode of the electively enabled switch to disable the electively enabled switch.

10. A method of forming an igniter circuit comprising:
    configuring the igniter circuit to receive a DC voltage from a DC voltage source;
    configuring the igniter circuit to selectively enable a first switch to couple the DC voltage to an output of the igniter circuit, wherein the output is configured for coupling to a primary side of an ignition coil;
    configuring the igniter circuit to control a state of a load switch to control a load current through the load switch;
    configuring the igniter circuit to selective set a threshold value of the load current;
    configuring the igniter circuit to selectively disable the load switch in response to a value of the load current exceeding the threshold value; and
    configuring the igniter circuit to selectively disable the load switch in response to detecting a failed condition of the first switch.

11. The method of claim 10 further including configuring the igniter circuit to disable the first switch in response to the load current exceeding the threshold value.

12. The method of claim 10 wherein configuring the igniter circuit to selectively disable the load switch includes configuring the igniter circuit to selectively disable the load switch in response to a voltage across the first switch having a value that is less than a diagnostic threshold value while the first switch is disabled.

13. The method of claim 12 including configuring the igniter circuit to selectively disable the first switch in addition to the load switch.

14. The method of claim 10 wherein configuring the igniter circuit to selectively disable the load switch includes configuring a diagnostic circuit to disable the first switch in response to a negated control state of the load switch and to detect a voltage on an output of the first switch having a value no greater than a diagnostic threshold value.

15. The method of claim 10 wherein configuring the igniter circuit to selective set the threshold value of the load current includes configuring the igniter circuit to selective set the threshold value of the load current in response to an asserted control state or negated control state of the load switch.

16. A method of forming an igniter circuit comprising:
    configuring the igniter circuit to enable a first switch to couple a DC voltage source to an output that is configured for coupling to a primary side of an ignition coil;
    configuring the igniter circuit control a load switch to form a load current through the ignition coil; and
    configuring the igniter circuit to determine a failure of the first switch and to responsively disable the load switch.

17. The method of claim 16 wherein configuring the igniter circuit to determine the failure of the first switch includes configuring the igniter circuit to detect a voltage on an output of the first switch having a value different from a diagnostic threshold value during a time interval wherein the first switch is disabled.

18. The method of claim 17 further including configuring the igniter circuit to disable the load switch and addition to the first switch.

19. The method of claim 17 wherein configuring the igniter circuit to detect the voltage on an output of the first switch includes configuring the igniter circuit to detect a voltage drop across the first switch having a value less than the diagnostic threshold value.

20. The method of claim 19 further including configuring the igniter circuit to disable the load switch in response to the combination of expiration of the time interval and detecting the voltage drop across the first switch having the value less than the diagnostic threshold value.

* * * * *